(12) United States Patent
Olaker et al.

(10) Patent No.: US 8,020,063 B2
(45) Date of Patent: Sep. 13, 2011

(54) HIGH RATE, LONG BLOCK LENGTH, LOW DENSITY PARITY CHECK ENCODER

(75) Inventors: David A. Olaker, Melbourne, FL (US); Greg P. Segallis, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 1082 days.

(21) Appl. No.: 11/828,650

(22) Filed: Jul. 26, 2007

(65) Prior Publication Data

US 2009/0031200 A1 Jan. 29, 2009

(51) Int. Cl.
*H03M 13/00* (2006.01)
(52) U.S. Cl. .......................... 714/755; 714/786
(58) Field of Classification Search .................. 714/755, 714/786
See application file for complete search history.

(56) References Cited

U.S. PATENT DOCUMENTS

| | | | |
|---|---|---|---|
| 6,957,375 B2 | 10/2005 | Richardson | |
| 6,961,888 B2 | 11/2005 | Jin et al. | |
| 7,716,553 B2 * | 5/2010 | Kim et al. | 714/755 |
| 2007/0022354 A1 * | 1/2007 | Yu et al. | 714/755 |
| 2008/0126908 A1 * | 5/2008 | Lin | 714/758 |

OTHER PUBLICATIONS

IEEE: "IEEE standard for local and metropolitan area networks Part 16: Air interface for fixed and mobile broadband wireless access systems" [Online] Feb. 28, 2006, pp. 819-822, XP002494859. Retrieved from the Internet: URL:http://standards.ieee.org.getieee802/download/802.16e-2005.pdf> [retrieved on Sep. 8, 2008].

Thorpe, J., "Low-Density Parity-Check (LDPC) Codes Constructed from Protographes". IPN Progress Report 42-152, Aug. 15, 2003, pp. 1-7.

Mohiyuddin, et al, "Synthesizing Interconnect-Efficient Low Density Parity Check Codes", DAC 2004, Jun. 7-11, 2004, San Diego, California.

Zhang, et al, "Investigation of Error Floors of Structural Low-Density Parity-Check Codes by Hardware Emulation". Proceedings of IEEE GLOBECOM, San Francisco, CA, Nov. 2006.

(Continued)

*Primary Examiner* — Guy Lamarre
(74) *Attorney, Agent, or Firm* — Fox Rothschild, LLP; Robert J. Sacco

(57) ABSTRACT

There is provided a parity check encoder (100) comprising a data memory (PPDM) configured for storing input data, a calculation/parity result data store (CPRDS), and a selector/serializer (SS). The CPRDS (104,106) is coupled to the PPDM (102) and is configured to calculate parity bits in parallel using input data and information contained in a parity check matrix H. The SS (108) is coupled to the PPDM and CPRDS. The SS is configured to generate an encoded output sequence using the input data and parity bits. The matrix H is formed of a plurality of sub-matrices. Each sub-matrix of the sub-matrices is an all zero (0) matrix, an identity matrix, or a circular right shifted version of the identity matrix. A portion B of the matrix H includes a plurality of rows having two (2) ones (1), except for a first row which includes a single one (1).

23 Claims, 11 Drawing Sheets

OTHER PUBLICATIONS

Chen, "Ramanujan Graphs in the Construction of LDPC Codes", Electronic Proceedings of Undergraduate Mathematics Day. 2004, No. 1, http://www.udayton.edu/~mathdept/EPUMD/EPMUD.htm.

Shokrollahi, "LDPC Codes: An Introduction", Digital Fount, Inc., Fremont, CA. Apr. 2, 2003, pp. 1-34.

Gallager, "Low-Density Parity-Check Codes", Cambridge, Mass, Jul. 1963.

Campello, et al., "Designing LDPC Codes Using Bit Flipping", Proceeding International Conference Communications, Helsinki, Finland, pp. 55-59, 2001.

Hu, et al., "Regular and Irregular Progressive Edge-Growth Tanner Graphs", Proceeding IEEE Global Telecommunications Conference, vol. 2, pp. 995-1001, Nov. 2001.

* cited by examiner

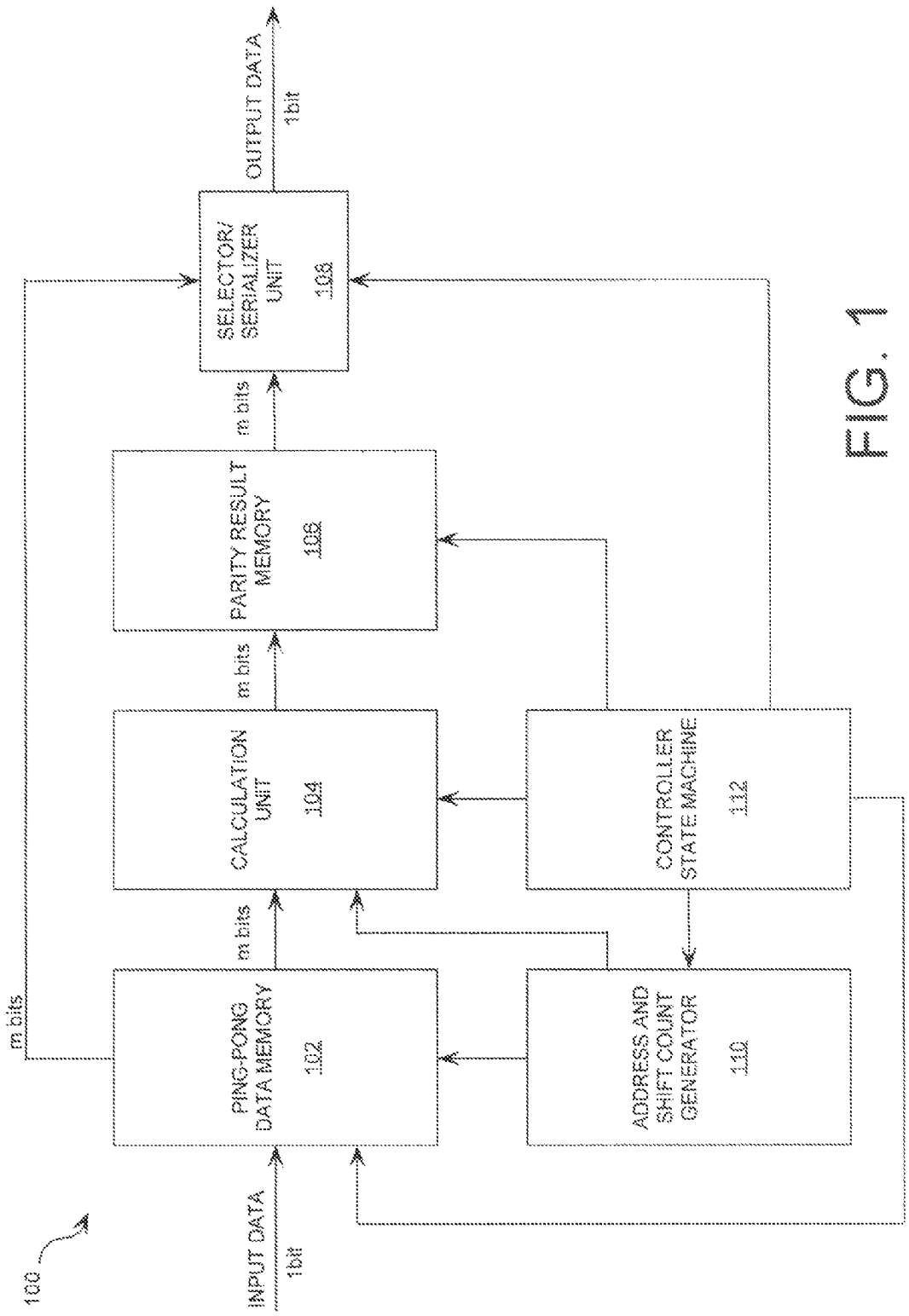

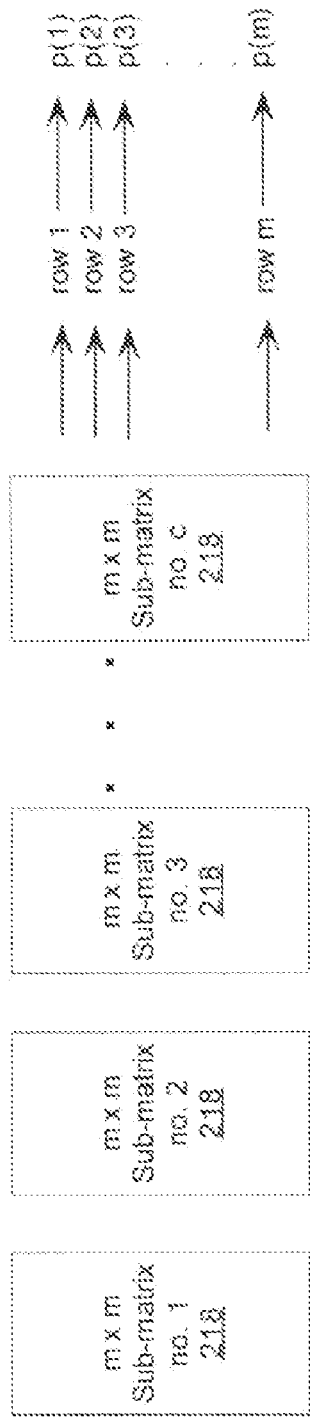

HIGH RATE, LONG BLOCK LENGTH, LOW DENSITY PARITY CHECK ENCODER

BACKGROUND OF THE INVENTION

1. Statement of the Technical Field

The inventive arrangements relate to forward error correction code encoders. More particularly, the present invention relates to an encoder for Low Density Parity Check (LDPC) codes with particular structural features, allowing for long block lengths and high throughput rates.

2. Description of the Related Art

There are many types of forward error correction codes (FECCs) known in the art. One such type of FECC is a Low Density Parity Check (LDPC) code. A detailed description of LDPC codes can be found in "Low Density Party-Check Codes", M.I.T. Press, 1963, written by Robert G. Gallager. The entire disclosure of this publication is incorporated herein by reference. An LDPC code can allow error free transmission of data across a channel at close to the theoretical limit of a channel capacity. LDPC codes were not used at the time of their creation (i.e., 1960) because encoder and decoder implementations were not reasonably practical. However, there have been many developments in the field of electronics and computer science that allow for a reasonably practical implementation of algorithms for generating LDPC codes.

There are several approaches which have emerged for generating FECC codes having good performance characteristics. One such approach involves designing LDPC codes using bit flipping. A detailed description of this approach can be found in "Designing LDPC Codes Using Sit Flipping", Proceeding international Conference Communications, Helsinki, Finland, pp. 55-59, 2001, written by J. Campello, D. S. Modha, and S. Rajagopalan. The entire disclosure of this publication is incorporated herein by reference. Another such approach involves implementation of a progressive edge growth (PEG) algorithm. A detailed description of this approach can foe found in "Progressive Edge-Growth Tanner Graphs", Proceeding IEEE Global Telecommunications Conference, vol. 2, pp. 995-1001, November 2001, written by X. Y, Hu, E. Eleftheriou, and D. M. Arnold. The entire disclosure of this publication is also incorporated herein by reference.

Despite the advantages of these approaches, they suffer from certain drawbacks. For example, these approaches do not provide optimized hardware and/or software implementations of an algorithm for generating an FECC code. For example: the PEG algorithm can be used in an IEEE 802.16 Broadband Wireless Access standard application. In such a scenario, the parity check code generated using the PEG algorithm has a relatively short block length. This short block length is due to the complexity of the hardware implementation of the PEG algorithm. The complex hardware implementation of the PEG algorithm can provide a relatively low data throughput rate feature to the Broadband communications system.

Significantly, the conventional hardware implementations for LDPC encoders are generally optimized for relatively short block lengths. For example, relatively short block lengths can include code blocks having a length less than about 10 kilo-bits. But it should be noted that the effectiveness of these LDPC codes improves dramatically with increasing block length. Such conventional hardware implementations for LDPC encoders do not provide a practical means for handling block lengths in the range greater than about 10 kilo-bits.

In view of the forgoing, there is a need for a practical hardware implementation of an algorithm for generating an LDPC code. There is also a need for a hardware implementation of an algorithm for generating an LDPC code with a long block length. There is further a need for a hardware implementation of an LDPC algorithm having a relatively high data throughput rate feature.

SUMMARY OF THE INVENTION

The invention concerns a method and system for generating a low-density parity-check code. The method begins by using a code block of binary information bits to calculate a plurality of parity bits based on a defined parity check matrix H. The parity check matrix H represents a set of linear modulo 2 parity check equations. The method also includes the step of combining the plurality of parity bits with the block of binary information bits to form a code word. The parity check matrix H is defined to include portions A and B such that the parity check matrix H=[A|B], and each row of the parity check matrix H represents one of the parity check equations for generating one of the parity bits. Further the parity check matrix H is constrained so that the portions A and B are each defined by a plurality of m by m bit sub-matrixes, and constraining each the sub-matrix to be an all zero (0) matrix, an identity matrix, or a circular right shifted version of the identity matrix.

The method further includes constraining the parity check matrix H so that each row of the portion B has two values which are equal to the number 1, except for a first row of the portion B which includes a single value equal to the number 1. The B portion is also constrained to exclusively includes the value 1 on the main diagonal and on a second diagonal that is left circularly shifted m times from the main diagonal.

The code block can contain k bits. In this regard, the method further includes storing the code block in a data memory device as r, m-bit code words, where r equal k/m. Stated differently, this step can be though of as arranging the k bits into r, m-bit code words.

A predetermined number d of the m-bit code words are selected to perform calculations for determining a set of m parity bits, in particular, each of the d, m-bit code words is selected only if a column position of the m-bit code word corresponds to one of m column positions contained within one of the sub-matrixes which has a non-zero value. The d, m-bit code words and the sub-matrixes with non-zero values are used to perform calculations for determining at least one parity bit corresponding to a row of the matrix H. More particularly, the d, m-bit code words and the sub-matrixes with non-zero values are used to concurrently perform m parallel sets of the calculations for determining a set of m parity bits corresponding to m rows of the matrix H. These m parallel calculations are advantageously repeated for each row of sub-matrixes which are contained in the H matrix.

The invention also includes a system for generating a low-density parity-cheek code. The system includes a data memory device for storing a block of binary information bits comprising a code block. The system also includes a calculation unit coupled to the data memory and configured for calculating a plurality of parity bits based on a defined parity check matrix H representing a set of linear modulo 2 parity check equations. A selector/serializer is provided that is capable of combining the plurality of parity bits with the block of binary information bits to form a code word. The parity check matrix H include portions A and B which are constrained as described above.

The data memory device is arranged for storing the k bit code block in the data memory device as r, m-bit code words, where r equal k/m. An address generator is provided which is configured for selecting a predetermined number d of the m-bit code words to perform calculations for determining a set of m parity bits. The address generator selects each of the d, m-bit code words only if a column position of the m-bit code word corresponds to one of m column positions contained with one of the sub-matrixes which has a non-zero value.

The calculation unit is arranged for using the d, m-bit code words and the sub-matrixes with non-zero values to perform calculations for determining at least one parity bit corresponding to a row of the matrix H. In particular, the calculation unit has a parallel type architecture for using the d, m-bit code words and the sub-matrixes with non-zero values to concurrently perform m parallel sets of the calculations for determining a set of m parity bits corresponding to m rows of the matrix H. The calculation unit also includes a shifter configured for performing a circular shift of at least one of the code words.

BRIEF DESCRIPTION OF THE DRAWINGS

Embodiments will be described with reference to the following drawing figures, in which like numerals represent like items throughout the figures, and in which:

FIG. 1 is a block diagram of an LDPC encoder that is useful for understanding the present invention.

FIG. 3C is a conceptual drawing that is useful for understanding how the parity bit calculations are performed.

FIG. 3D is a drawing that is useful for understanding how a m-bit words comprised of parity bits are stored in a parity memory.

DETAILED DESCRIPTION OF THE PREFERRED EMBODIMENTS

Figure 2A:
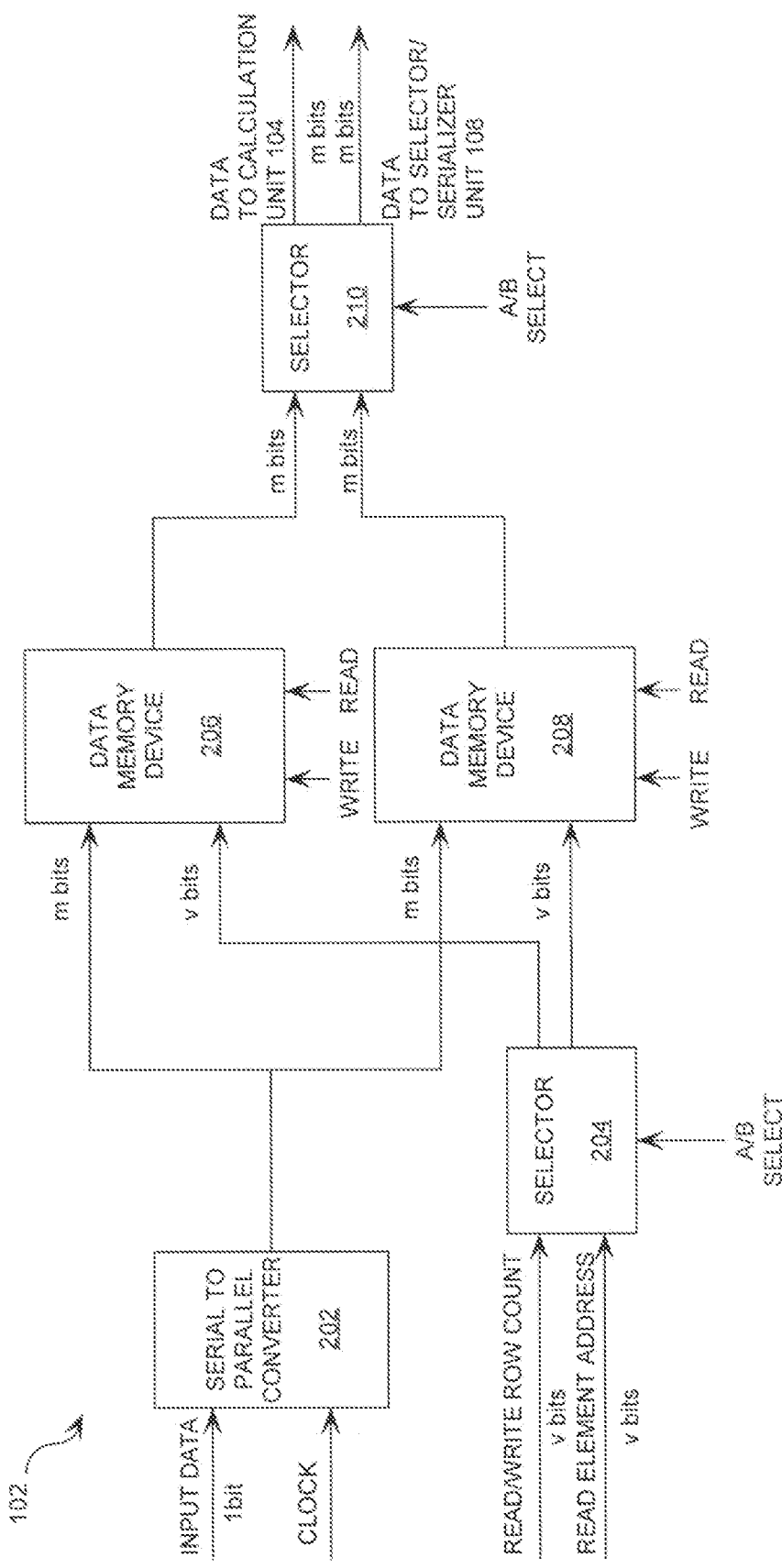
FIG. 2A is a block diagram of a data memory shown in FIG. 1 that is useful for understanding the present invention.

An embodiment of the present invention will be described with respect to FIG. 1 through FIG. 7. Some embodiments of the present invention provide methods, systems, and apparatus relating to forward error correction code (FECC) encoders. Some embodiments of the present invention also provide an FECC encoder implementing an LDPC algorithm. The algorithm is provided for generating an LDPC code with a long block length. Some embodiments of the present invention also provide an FECC encoder having a relatively high data throughput rate feature. Prior to describing the embodiments of FIG. 1 through FIG. 7, a brief discussion of an LDPC algorithm is provided to assist a reader in understanding the present invention.

LDPC Algorithm

As should be understood, a block code is generally characterized by its block length. A block code is also defined as an (n, k) code, where k is a number of input bits and n is a number of bits per code word. A block code is often employed to convert k input bits to n bit code words. It should also be understood that a code rate is generally defined by a ratio of the number of input bits k divided by the number of bits per code word n. For example, a block code is defined as a (8192, 4096) code. In such a scenario, the code rate of the block code can be computed as follows: code rate=k/n=4096/8192=0.5. Accordingly, this block code is also referred to as a rate one half (½) code. Other code rates include, but are not limited to three fourths (¾), seven-eights (⅞), and two-thirds (⅔).

As should also be understood, a parity check code is defined by a parity check matrix H. The parity check matrix H is of a size (n-k) rows by n columns. The parity matrix H can be defined by the following matrix (1).

$$H = \begin{vmatrix} 1 & 2 & 3 & \ldots & n \\ 2 & & & & \\ 3 & & & & \\ \ldots & & & & \\ \ldots & & & & \\ n-k & & & & \end{vmatrix} \quad (1)$$

The parity check matrix H can include matrices A and B. As such, the parity check matrix H can be generally defined as [A|B]. A is a (n-k) by (k) matrix of binary values zero (0) and one (1). The columns of the portion A of parity check matrix H correspond to input data bits i(0) through i(k-1). B is (n-k) by (n-k) matrix of binary values zero (0) and one (1). The columns of portion B of the parity check matrix H correspond to parity bits p(0) through p(n-k-1). Accordingly, the parity check matrix H can be defined by the following matrix (2).

$$H = [A|B] = \begin{vmatrix} 1 & 2 & 3 & \ldots & k \\ 2 & & & & \\ 3 & & & & \\ \ldots & & & & \\ \ldots & & & & \\ n-k & & & & \end{vmatrix} \begin{vmatrix} 1 & 2 & 3 & \ldots & n-k \\ 2 & & & & \\ 3 & & & & \\ \ldots & & & & \\ \ldots & & & & \\ n-k & & & & \end{vmatrix} \quad (2)$$
$$\underbrace{\phantom{xxxxx}}_{A} \quad \underbrace{\phantom{xxxxx}}_{B}$$

Each row of the matrix hi corresponds to a mathematical equation for generating a particular parity bit which is appended to input data bits to form a code word. For example, portion A of parity check matrix H includes a value one (1) in a matrix position defined by a particular row and column. The column number indicates that a particular input bit is to be used in a modulo two (2) addition operation to form a parity bit of that row.

A mathematical equation for an LDPC code generation can be defined as [input data block]+[parity bits]=0. Each row of the parity check matrix H is of the form $i(a)+i(b)+\ldots+i(f)+p(e)+\ldots+p(g)+\ldots=0$, where $i(a), i(b), \ldots, i(f)$ are inputs bits. p(e), ..., p(g) are parity bits. This mathematical equation can be solved for a particular parity bit. For example, this mathematical equation is solved for a parity bit p(e). Consequently, p(e) equals i(a)+i(b)+ ..., +i(f)+p(g)|(e>g), where a, ..., g are the column numbers for the portion A of parity check matrix H for input data bits i(0) through i(k-1) or the portion B for parity bits p(0) through p(n-k-1).

A matrix operation that provides a completely random placement of binary values in a parity check matrix H can be implemented m hardware. However, such a hardware implementation is very difficult to design. Alternatively, standard matrix techniques can be used to implement a parity check matrix H operation in hardware. Still, this hardware implementation requires a k stage shift register and a k input modulo two (2) adder. This hardware implementation also requires a storage means for the whole (n-k) by n matrix.

Notably, a restriction of a placement of ones (1) in the matrix H can have a profound impact on the hardware implementation. For example, the form of the parity check matrix H can be restricted such that it has certain characteristics at a sub-level, i.e., the parity check matrix H is formed of a number of smaller sub-matrices. The form of each sub-matrix can he restricted such thai each sub-matrix is an all zero (0) matrix, an identity matrix, or a circular right shifted version of the identity matrix. The second portion B of the parity check matrix H can be restricted such that each row includes only two (2) ones (1)s except for the first row which includes only a single one (1).

In this regard it should be appreciated that the present invention includes an element restriction in the portion "A" of the parity check matrix H. More particularly, the matrix "A" includes a collection of smaller m by m sub-matrices. Each of the m by m sub-matrices is an all zero (0) matrix, an identity matrix, or a circular right shifted version of the identify matrix. For example, if m equals three (3), then each of the m by m sub-matrixes can be defined by one of the following matrices (3-6).

$$\begin{vmatrix} 0 & 0 & 0 \\ 0 & 0 & 0 \\ 0 & 0 & 0 \end{vmatrix} \quad (3)$$

$$\begin{vmatrix} 1 & 0 & 0 \\ 0 & 1 & 0 \\ 0 & 0 & 1 \end{vmatrix} \quad (4)$$

$$\begin{vmatrix} 0 & 1 & 0 \\ 0 & 0 & 1 \\ 1 & 0 & 0 \end{vmatrix} \quad (5)$$

$$\begin{vmatrix} 0 & 0 & 1 \\ 1 & 0 & 0 \\ 0 & 1 & 0 \end{vmatrix} \quad (6)$$

It should be noted that the matrix (3) is an all zero matrix. The matrix (4) is an identity matrix. The matrices (5) and (8) are circular right shifted versions of the identity matrix (4).

Accordingly, the parity check matrix H can be redefined as a (n-k)/m row by an n/m column matrix. The value (n-k)/m is hereinafter referred to as "r". The value n/m is hereinafter referred to as "c". Accordingly, the parity check matrix H can be defined by the following matrix (7).

$$H = [A | B] = \begin{vmatrix} 1 & 2 & 3 & \dots & c \\ 2 & & & & \\ 3 & & & & \\ \dots & & & & \\ \dots & & & & \\ r & & & & \end{vmatrix} \quad (7)$$

The locations and shifts of the non-zero elements in the matrix "A" of the parity check matrix H can be selected for designing an LDPC code with good error correction performance. For example, a matrix "A" of a parity check matrix H can be defined by the following matrix (8).

$$\begin{vmatrix} 1 & 0 & 0 & 0 & 0 & 0 & 0 & 1 & 0 \\ 0 & 1 & 0 & 0 & 0 & 0 & 0 & 0 & 1 \\ 0 & 0 & 1 & 0 & 0 & 0 & 1 & 0 & 0 \\ 0 & 0 & 0 & 0 & 0 & 1 & 1 & 0 & 0 \\ 0 & 0 & 0 & 1 & 0 & 0 & 0 & 1 & 0 \\ 0 & 0 & 0 & 0 & 1 & 0 & 0 & 0 & 1 \\ 0 & 1 & 0 & 1 & 0 & 0 & 0 & 0 & 0 \\ 1 & 0 & 0 & 0 & 1 & 0 & 0 & 0 & 0 \\ 0 & 0 & 1 & 0 & 0 & 1 & 0 & 0 & 0 \end{vmatrix} \quad (8)$$

It should be noted that the matrix (8) is a nine by nine (9×9) matrix made up of nine (9) three by three (3×3) sub-matrices.

The present invention also includes an element restriction in a matrix "B" of the parity check matrix H. More particularly, the matrix "B" of the parity check matrix H includes a collection of smaller m by m sub-matrices. Each sub-matrix is an all zero (0) matrix, an identity matrix, or a circular right shitted version of the identity matrix. The structure of the matrix "B" is further restricted so that it has all ones (1) on a main diagonal and on a diagonal that is left circularly shifted m times from the main diagonal. However, the last sub-matrix in a first row of the matrix "B" consists of a diagonal matrix left shifted one place, A one (1) element in a first row of the last sub-matrix is deleted. As such, the form of the second portion B of the parity check matrix H is further restricted such that each row includes two (2) ones (1), except for the first row which includes a single one (1). For example, a matrix "B" of a parity check matrix H can be defined by the following matrix (9).

$$\begin{vmatrix} 1 & 0 & 0 & 0 & 0 & 0 & 0 & 0 & 0 \\ 0 & 1 & 0 & 0 & 0 & 0 & 1 & 0 & 0 \\ 0 & 0 & 1 & 0 & 0 & 0 & 0 & 1 & 0 \\ 1 & 0 & 0 & 1 & 0 & 0 & 0 & 0 & 0 \\ 0 & 1 & 0 & 0 & 1 & 0 & 0 & 0 & 0 \\ 0 & 0 & 1 & 0 & 0 & 1 & 0 & 0 & 0 \\ 0 & 0 & 0 & 1 & 0 & 0 & 1 & 0 & 0 \\ 0 & 0 & 0 & 0 & 1 & 0 & 0 & 1 & 0 \\ 0 & 0 & 0 & 0 & 0 & 1 & 0 & 0 & 1 \end{vmatrix} \quad (9)$$

It should be noted that the matrix (9) is a nine by nine (9×9) matrix made up of nine (9) three by three (3×3) sub-matrices.

Hardware Implementation

Various conventional hardware implementations can be used for an LDPC encoder in which the parity check matrix H is constrained as described above. For example, an LDPC encoder can be comprised of a first k bit shift register for the input data, d times k, (d+1) modulo adders, followed by a second k bit shift register. However, this LDPC encoder architecture requires a large number of hardware elements to implement. Another conventional approach to the encoder hardware implementation would include large switch matrices configured to route bits to a plurality of modulo adders. Notably, this switch matrices LDPC encoder architecture also requires a large number of hardware elements. Accordingly, an improved LDPC encoder 100 architecture is provided which takes advantage of the unique constraints defined above with respect to the parity check matrix H.

For example, by constraining the parity check matrix as described above, a number of bits required to be stored in a memory for representing the parity check matrix H can be made relatively small as compared to conventional hardware implementations, in this regard, it should be appreciated that each non-zero sub-matrix can be identified by simply identifying for each row r of the parity check matrix, which columns of the (c-r) columns the non-zero sub-matrix resides in. The non-zero sub-matrix can also be defined by identifying, with regard to each sub-matrix, which of "m" possible shifts is used for creating a circular right shifted version of an identity matrix. As a consequence of such sub-matrix identification processes, the number of bits required to be stored in a memory for representing the parity check matrix H is greatly reduced. In particular, by utilizing the foregoing technique for representing the parity check matrix H, the number of bits required to be stored in memory for representing the parity check matrix H is reduced from [n·k] bits to [d·(k/m)·(log$_2$ (k/m)·log$_2$ m)], where n is a number if bits in an encoded block, k is a number of bits in a block prior to being encoded, d is a maximum number of non-zero sub-matrices in a row of the parity check matrix H, and m is a number of rows or columns of a sub-matrix.

Further, with the limitations described herein on parity check matrix H, arithmetic operations for computing parity bits can be performed in parallel, thereby providing an improved processing time to the hardware implementation. This advantageously permits a hardware implementation to generate m parity bits in parallel, without having to individually fetch the input data bits. These features and others will be discussed below in further detail.

Referring now to FIG. 1, there is provided a block diagram of an LDPC encoder 100 that is useful for understanding the present invention, it should be understood that the LDPC encoder 100 is configured to allow long block lengths and high throughput rates. As shown in FIG. 1, the LDPC encoder 100 is comprised of a data memory 102, a calculation unit 104, a parity result memory 108, and a selector/serializer unit 108. The LDPC encoder 100 is also comprised of an address and shift count (ASC) generator 110 and a controller state machine 112.

The data memory 102 is provided to improve speed of the LDPC encoder 100, The data memory 102 is configured to allow full rate real time encoding of an incoming input data stream. The data memory 102 is also configured to allow parallel data storage and processing, in this regard, it should be understood that the data memory 102 is comprised of two (2) data memory devices (described below in relation to FIG. 2). Each of the data memory devices is configured to concurrently store incoming input data and make input data available to the calculation unit 104 when needed for calculations of parity bits and/or the selector/serializer unit 108 when needed for generating an encoded output. The data memory 102 will be described in greater detail below in relation to FIG. 2A.

The calculation unit 104 is configured to calculate parity bits using input data received from the data memory 102. In this regard, it should be appreciated that the parity bits are calculated using the parity check matrix H. The calculation unit 104 is also configured to communicate parity bits to the parity result memory 106 for storage and further processing. The calculation unit 104 will be described in greater detail below in relation to FIG. 3A and FIG. 4.

The parity result memory 108 is configured to receive parity bits from the calculation unit 104. The parity result memory 108 is also configured to write received parity bits to a parity memory device (described below in relation to FIG. 5), read parity bits from a parity memory device (described below in relation to FIG. 5), select a parity memory device to receive data from, select a last result register (described below in relation to FIG. 5) to receive data from, and compute a sum and carry value via an addition operation. The parity result memory 106 is further configured to allow parallel data storage and processing. In this regard, it should be understood that the parity result memory 106 is comprised of two (2) parity memory devices operating in an alternating manner (described below in relation to FIG. 5). The parity result memory 106 will be described in greater detail below in relation to FIG. 5.

The selector/serializer unit 108 is configured to select either the data memory 102 or the parity result memory 106 to obtain data from. The selector/serializer unit 108 is also configured to serialize received data from the data memory 102 and/or the parity result memory 108. This serialization process includes converting the received data from a parallel format into a serial communications format, i.e., convert parallel data into a serial data stream. It should be understood that the selector/serializer unit 108 produces an encoded output having a first portion and a second portion. The first portion includes input data received from the data memory 102. The second portion includes parity bits received from the parity result memory 106. The selector/serializer unit 108 will be described in greater detail below in relation to FIG. 6.

The ASC generator 110 is comprised of matrix lookup tables (described below in relation to FIG. 7 containing information which defines the parity check matrix H. In this regard, it should be appreciated that a first one of the matrix lookup tables contains address information which identifies the locations of non-zero elements in the portion A of the parity check matrix H. A second one of the matrix lookup tables contains shift count information to be provided to the calculation unit 104 for circularly shifting m bits of an m bit word. The ASC generator 110 is configured to access and retrieve data from the matrix lookup tables. The ASC generator 110 is also configured to generate read addresses for a memory location in the data memory 102 using the data obtained from a first matrix lookup table and to generate shift count values using the data obtained from a second matrix lookup fable. The ASC generator 110 is further configured to communicate read addresses to the data memory 102 and shift count values to the calculation unit 104. The ASC generator 110 will be described in greater detail below in relation to FIG. 7.

The controller state machine 112 is provided for controlling the data memory 102, the calculation unit 104, the parity result memory 108, the selector/serializer unit 108, and the ASC generator 110. Controller state machines are well known to persons skilled in the art, and therefore will not be described in great detail herein. However, it should be understood that the controller state machine 112 is comprised of hardware and/or software configured to communicate control signals to each of these listed components 102, 104, 108, 108, 110.

Referring now to FIG. 2A, there is provided a block diagram of the data memory 102 that is useful for understanding the present invention. As shown in FIG. 2A, the data memory 102 is comprised of a serial to parallel (S/P) converter 202, selectors 204, 210, and data memory devices 206, 208. Each of the listed components 202-210 is well known to persons skilled in the art, and therefore will not: be described in great detail herein. However, a brief discussion of the data memory 102 architecture is provided to assist a reader in understanding the present invention.

Referring again to FIG. 2A, the S/P converter 202 is comprised of hardware and/or software configured to receive a serial input data stream from an external device (not shown). The S/F converter 202 is also comprised of hardware and/or software configured to transform a serial input data stream to a parallel output data. The parallel output data includes a plurality of words. Each word contains m bits of input data. This m bit word size is selected to correspond to the m by m size of each sub-matrix as discussed above. The S/P converter 202 is further comprised of hardware and/or software configured to write m bit words to the data memory devices 206, 208. As shown in FIG. 2A, a clock pulse is communicated from an external clock (not shown) to the S/P converter 202 for driving the same. The clock pulse can be synchronized with the serial input data stream. The clock pulse can be employed as a trigger to convert the serial input data stream into parallel output data. The clock pulse can also be employed as a trigger to write m bit words to the data memory devices 206, 208.

Each of the data memory devices 206, 208 is comprised of hardware and/or software configured to receive parallel input data from the S/P converter 202 and to store the same. Each data memory device 206, 208 has a memory storage capacity sufficient to store an entire input data code block of k bits. Entire code blocks of input data are respectively written to memory device 206 and memory device 208. For example, a first complete code block of input data can be stored in a first data memory device 208, after which a second complete code block of input data can be stored in the second data memory device 207.

It should be appreciated that the parallel input data is stored in a memory away of the data memory devices 206, 208 that consists of r addresses of m bit words. Each of the data memory devices 206, 208 is also comprised of hardware and/or software configured to receive a signal including read/write row count data or read element address data from the selector 204. The data memory devices 206, 208 use the read/write row count data to store m bit words in sequentially ordered memory locations. The data memory devices 206, 208 use the read element address data to retrieve m bit words from memory locations. Each of the data memory devices 206, 208 is further comprised of hardware and/or software configured to communicate data to the selector 210.

As should be appreciated, a write or read signal is communicated from the controller state machine 112 (described above in relation to FIG. 1) to the data memory devices 206, 208 for controlling the same. For example, if the controller state machine 112 communicates a write control signal to the data memory devices 206, 208, then the data is written to memory locations in data memory devices 206, 208. Alternatively, if the controller state machine 112 communicates a read control signal to the data memory devices 206, 208, then date is retrieved from memory locations associated with data memory devices 206, 208 and forwarded to the selector 210.

The selector 204 is comprised of hardware and/or software configured to receive (1) read/write row count data or (2) read element address data from the ASC generator 110. The read/write row count data includes information necessary for performing the read/write process described above with respect to data memory devices 206, 208. The selector 204 is also comprised of hardware and/or software configured to forward read/write row count data to the data memory devices 206, 208 for performing the read/write process described above.

The read element address data includes address information for reading data from data memory device 206, 208 locations when such data is needed for parity check calculations. The selector 204 is further comprised of hardware and/or software configured to selectively forward a signal including read element address data to the data memory devices 206, 208 for reading data from memory locations.

Referring again to FIG, 2A, an A/B select signal is communicated from the controller state machine 112 (described above in relation to FIG. 1) to the selector 204 for controlling the same. For example, if the A/B select signal is a high logic signal, then the selector 204 forwards a signal including read/write row count data to the data memory device 206. The selector 204 also forwards a signal including read element address data to the data memory device 208. Alternatively, if the A/B select signal is a low logic signal, then the selector 204 forwards a signal including read element address data to the data memory device 206. The selector 204 forwards a signal including read/write row count data to the data memory device 208.

The selector 210 is comprised of hardware and/or software configured to receive a signal including input data from the data memory devices 206, 208. The selector 210 is also comprised of hardware and/or software configured to forward signals from each of the data memory devices 206, 208 to a respective one of the calculation unit 104 (described above in relation to FIG. 1) or the selector/serializer 108 (described above in relation to FIG. 1). As should be understood, an A/B select signal is communicated from the controller state machine 112 to the selector 210 for controlling the same. For example, if the A/B select signal is a high logic signal, then the selector 210 forwards a signal from the data memory device 206 to the calculation unit 104. The selector 210 also forwards a signal from the data memory device 208 to the selector/serializer 108. Alternatively, if the A/B select signal is a low logic signal, then the selector 210 forwards a signal from the data memory device 208 to the calculation unit 104. The selector 210 also forwards a signal from the data memory device 206 to the selector/serializer 108.

Figure 2B:
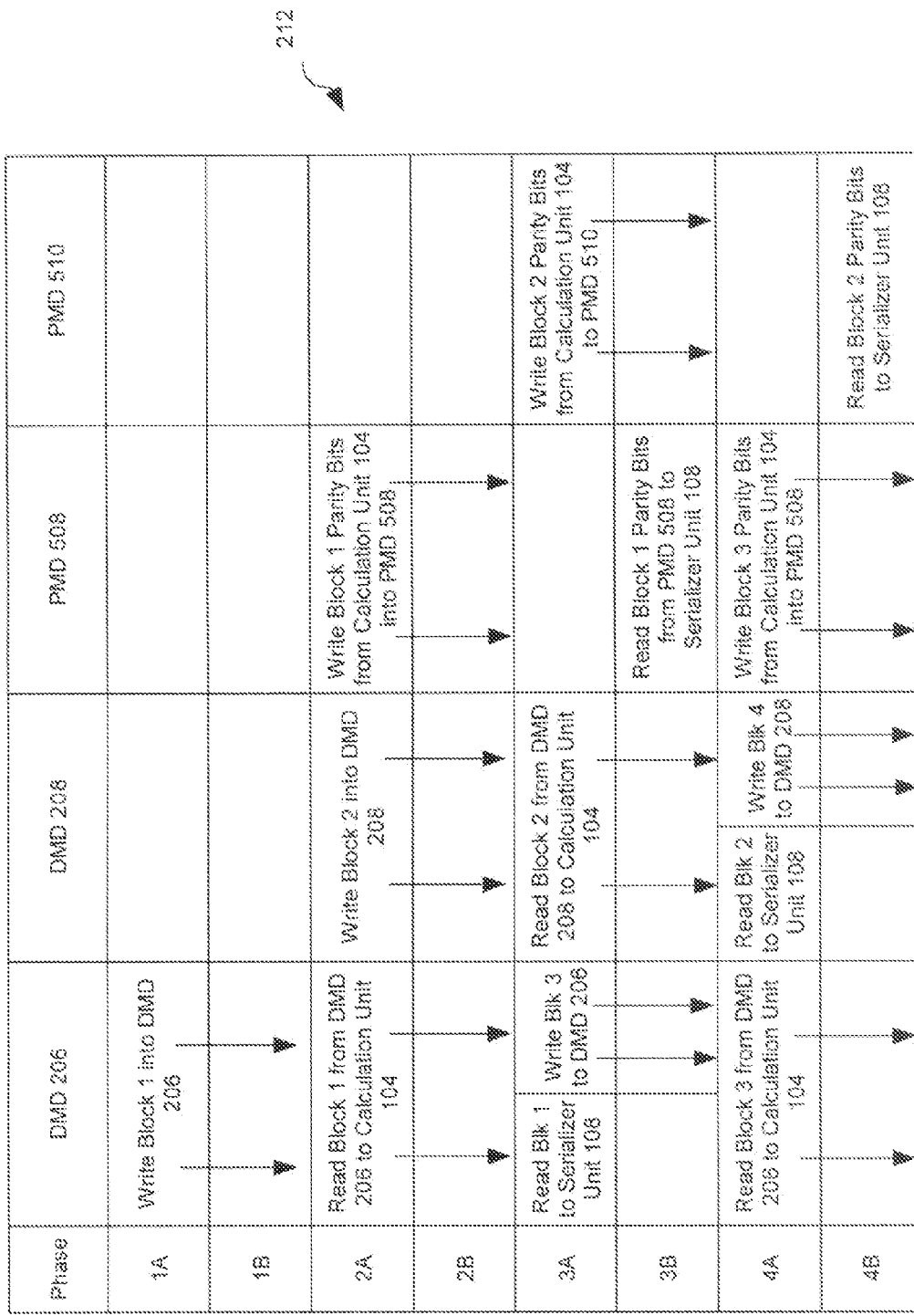
FIG. 2B is a table that is useful for understanding the operation of the data memory in FIG. 2A.

Referring now to FIG. 2B, there is provided a table 212 which is useful for understanding the operation of the data memory 102. The table 212 is divided into a series of chronologically ordered operational phases numbered 1-4, each of which is divided into a chronologically ordered A and a B portion. The operation of the data memory 102 begins in phase 1A when a code block 1 is written into data memory device (DMD) 206. This process can continue during phase 1B.

During phase 2A and 2B code block 1 is read from data memory device 206 to the calculation unit 104. Concurrently, during phase 2A and 2B, a code block 2 is written into the other data memory device 208. Also during phase 2A and 2B, the calculation unit 104 can calculate parity hits for block 1, and can send those parity bits to parity memory device (PMD) 508.

Figure 2C:
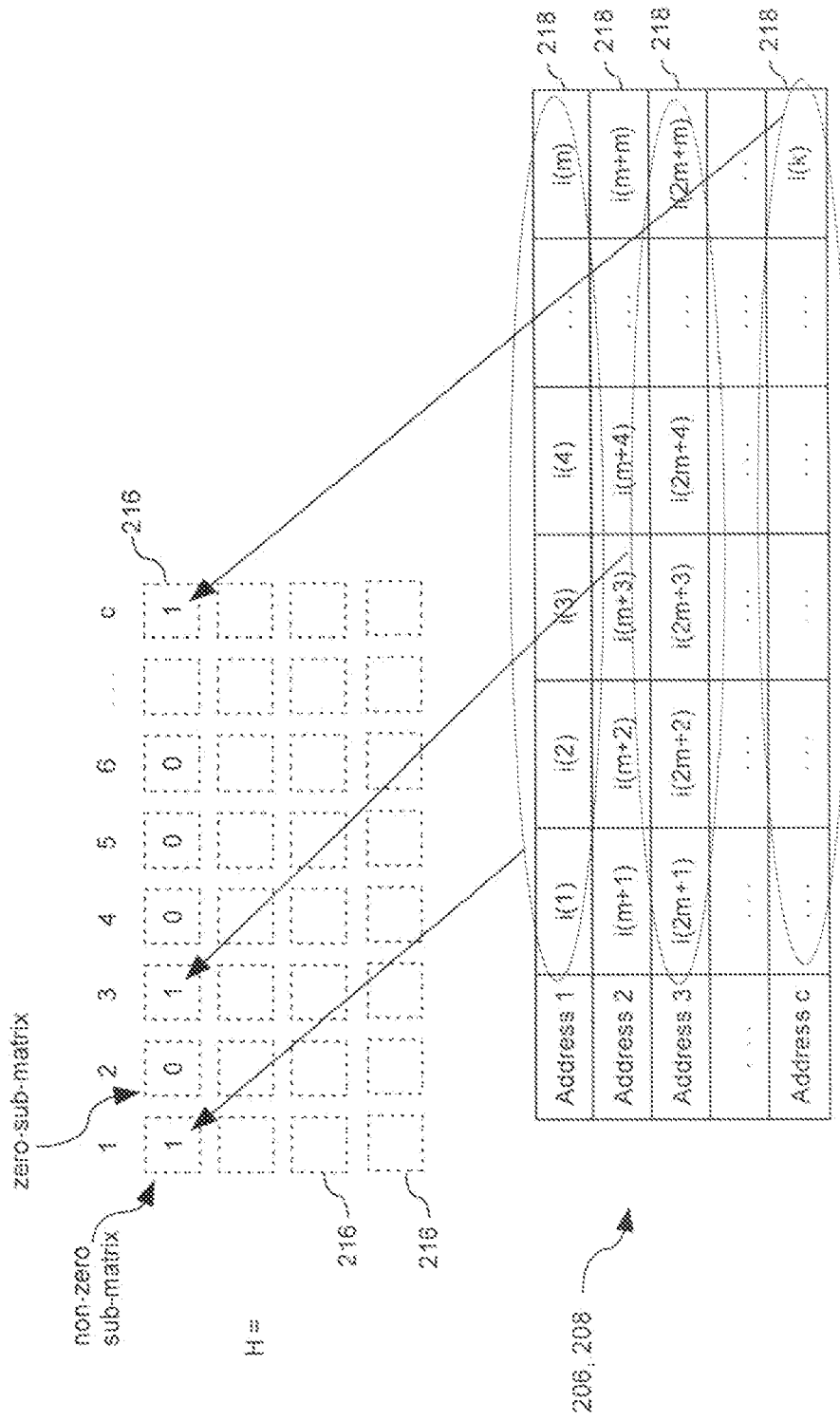
FIG. 2C is a conceptual drawing that it is useful for understanding how d, m-bit words are selected from a code block for use in calculating partly bits.

FIG. 2C is a drawing which is useful for understanding the arrangement of data which is written to each data memory device 208, 208, As illustrated therein, each data memory device can have a series of memory addresses 1 through r. Each memory address can contain a series of m input data bits, each comprising a cede word, and associated with a k bit input code block. Notably, each column corresponds to one of the c columns identified in matrix (7) shown above.

In phase 3A, two processes occur in parallel in DMD 208 as shown. Block 1 code words are read from the data memory device 206, and sent to the selector/serializer unit 108. Once each code word from block 1 has been sent to the serializer there is no longer a need to store that code word in the data memory device 206. Accordingly, such code words can be overwritten in data memory device 206. In particular, the next code block (block 3) can be read into the data memory device 206 as code words from block 1 are read out. This process involves periodically interrupting the read out of code words from block 1 to allow code words of block 3 to be written.

It should be understood that data is read from the data memory device 206 at a data rate that is different than the data rate employed for writing data to the data memory device 206. Accordingly, a read and write pattern will have to be adjusted accordingly. For example, in the case of a half rate code this pattern is defined as two (2) reads, followed by one (1) write. This data rate configuration ensures that data is read from the memories 208 before being overwritten by the input data. The foregoing pattern can be modified as necessary to achieve the proper input to output data rate ratio. For example, a block code selected as a rate three-fourth (¾) code requires a specific read and write pattern. This pattern is generally defined as two (2) reads, one (1) write, one (1) read, one (1) write, one (1) read, and one (1) write. This pattern is repealed until the end of a code block. Still, the invention is not limited in this regard.

During phase 3A, the pattern of reading and writing can continue as described with regard to memory device 206. Note however that all of the code words for code block 1 will be read out of data memory device 206 before all of code block 3 has been written to the device. When this occurs, code block 3 can be continuously written into data memory device 208 without interruption.

During phase 3A and 3B, code words associated with code block 2 are read from data, memory device 208 to calculation unit 104. Concurrently, during phase 38, block 1 parity bits can be read from the parity memory device 508 to the serializer unit 108. The serializer will append these parity bits to the input data bits of code block 2. Also during phases 3A and 3B, the parity bits associated with code block 2 are being calculated in calculation unit 104, and written to parity memory device 510.

In phase 4A, two processes occur in parallel in DMD 208 as shown. Block 2 code words are read from the data memory device 208, and sent to the selector/serializer unit 103. Once each code word from block 2 has bean sent to the serializer, there is no longer a need to store that code word hi the data memory device 203. Accordingly, such code words can be overwritten in data memory device 208. In particular, the next code block (block 4) can be read into the data memory device 208 as code words from block 2 are read out. This process involves periodically interrupting the read out of code words from block 2 to allow code words of block 4 to be written. It should be understood that data is read from the data memory device 208 at a data rate that is different than the data rate employed for writing data to the data memory device 208. Accordingly, a read and write pattern will have to be adjusted accordingly as described above in relation to data memory device 208.

During phase 4A, the pattern of reading and writing can continue as described with regard to memory device 208. Note however that all of the code words for code block 2 will be read out of data memory device 208 before all of code block 4 has been written to the device. When this occurs, code block 4 can be continuously written into data memory device 208 without interruption.

Also during phase 4A and 4B, the calculation unit 104 can calculate parity bits for block 3, and can send those parity bits to parity memory device (PMD) 508. Finally, during phase 4B, parity bits for block 2 can be read from PMD 510 and sent to serializer unit 108. These parity bits can be appended to the data bits as part of the coding process.

Figure 3A:
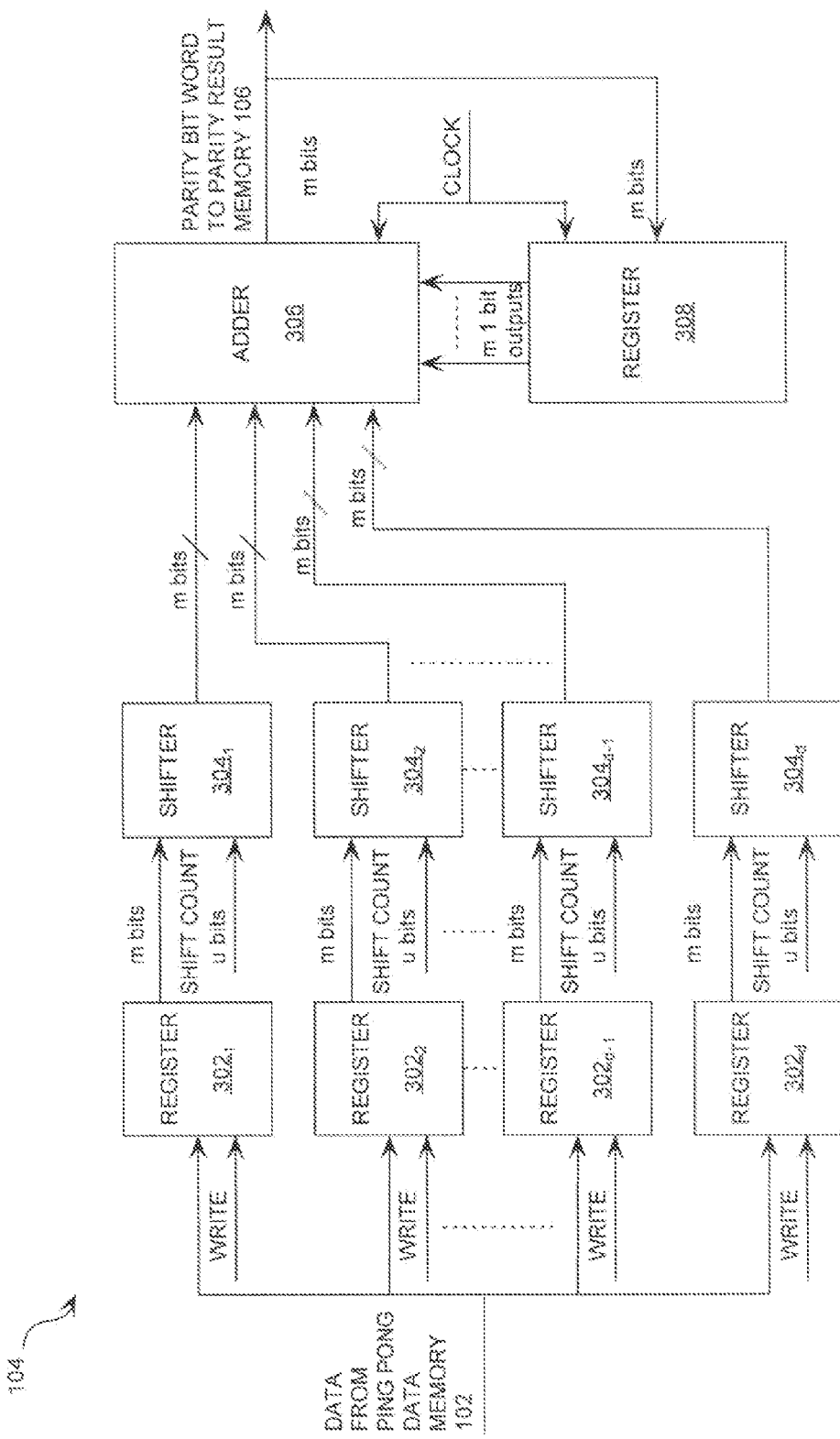
FIG. 3A is a block diagram of a calculation unit shown in FIG. 1 that is useful for understanding the present invention.

Referring now to FIG. 3A, there is provided a block diagram of a calculation unit 104 of FIG. 1. Prior to describing the hardware architecture of FIG. 3A in great detail, it should be understood that the unique design of the second portion B of the parity check matrix H has hardware implications with regard to the calculation unit 104.

Most Significantly, it should be noted that the calculation unit 104 performs calculations in parallel for m parity bits. Calculations for one parity bit are performed for each of m individual rows of the H matrix. In this regard, it should be recalled that each sub-matrix is m-bits by m-bits. Since each word is m-bits long, each sub-matrix 216 operates on only one m-bit word. Moreover, since there are m rows in each sub-matrix 218, one sub-matrix row can be used for calculations of each group of m parity bits.

Further, it will be recalled that the form of the second portion B of the parity check matrix H is restricted such that each row includes two (2) ones (1s), except for the first row which includes a single one (1). This restriction implies that a first parity bit p(0) depends only on input data bits. The remaining parity bits p(1), . . . , p(m-1) depend on input data bits and another parity bib Specifically, each parity bit p(t) other than a parity bit p(0) depends on a parity bit p(t−m) for (t≧m) and on a parity bit p((k−m−1)+t) for (t<m) k is a number of bits of input data code block (before encoding). From a hardware perspective, this means that each m bits of parity, except for a first set of bits, needs to have a previous set of m bits modulo two (2) added to the result of an input data calculation. Accordingly, the calculation unit 104 is comprised of a feedback mechanism. The feedback mechanism includes a register 308 configured to store previous parity bits and communicate the same to the adder 308 for use in subsequent parity bit calculations.

As shown in FIG. 3A, the calculation unit 104 is comprised of registers $302_1$-$302_d$, 308, shifters $304_1$-$304_d$, and an adder 306. Each of the listed components $302_1$-308 is well known to persons skilled in the art, and therefore will not be described in great detail herein. However, a brief discussion of the calculation unit 104 architecture is provided to assist a reader in understanding the present invention.

As noted above in relation to FIG. 2A and 2B, an input data code block is communicated from a data memory device 206, 208 to the calculation unit 104 for the purpose of calculating parity bits. In this regard, it will be recalled that the arrangement of the input data code block in each data memory device 206, 208 is illustrated in FIG. 2C. The arrangement is selected so as to correspond to the arrangement of the A portion of matrix H. In particular, the input date bits i(1) through i(k) of an input data code block correspond to column positions of the A portion of the parity check matrix H. This concept is shown in FIG. 2C. For each row count (corresponding to a row of the parity check matrix H), d words (each m bits long) are fetched from one of the data memory devices 206, 208, where d is the number of non-zero sub-matrixes in a row r of the H matrix.

In FIG. 2C, non-zero sub-matrixes are identified with a number 1 whereas zero type sub-matrixes are identified with the number zero, Note that it is unnecessary to fetch any of the m-bit words in data memory devices 206, 208 which are in any of the c columns corresponding to sub-matrixes which have a zero value since these words by definition will not have any effect on the parity bit calculation. The d words which are used are communicated through selector 210 to the calculation unit 104, and stored in d, m-bit shift registers $302_1$-$302d$. This concept is illustrated in FIG. 2C by arrows showing that selected ones of the m-bit words comprising an input data block in memory device 206, 208 are communicated to the shift registers $302_1$-$302_d$ if the corresponding sub-matrix, is non-zero.

Referring again to FIG. 3A, each of the registers $302_1$-$302_d$ is comprised of hardware and/or software configured to receive data from the data memory 102. Each of the registers $302_1$-$302_d$ is comprised of hardware and/or software configured to temporarily store received data as m bit words. As such, each of the registers $302_1$-$302_d$ receives a different m bit word from the data memory 102. As noted, these m-bit words are selected from a data memory device 206, 208 if they correspond to column positions associated with a sub-matrix 216 having a non-zero value.

Referring again to FIG. 3A, write signals are communicated from the controller state machine 112 (described above in relation to FIG. 1) to the registers $302_1$-$302_d$ for controlling the same. For example, if the first register $302_1$ receives a high logic write signal, then an m bit word containing input data is written to register $302_1$ memory locations. Alternatively, if the write signal is a low logic write signal, then data is not written to register $302_1$ memory locations. The registers $302_1$-$302_d$ are further comprised of hardware and/or software configured to communicate m bit words containing input data to the shifters $304_1$-$304_d$, respectively.

Prior to discussing the operation of the shifters $304_1$-$304_d$ a further discussion may be helpful for better understanding this aspect of the hardware implementation. One significant impact of the constraints placed on the parity check matrix H as disclosed herein is that, for each group of m parity bits to be generated, the bits are only a function of a small number of groups of consecutive input data bits, with each group having a spacing of m bits in time. This advantageously permits a hardware implementation to generate m parity bits in parallel, without having to individually fetch the data bits (which collectively number an amount equal to d▼m▼m). Instead, the constraints placed on the parity check matrix H are such that it is only necessary to fetch d sets of m bits for the calculation of the m parity bits.

Further, if will be appreciated that the constraints placed upon the sub-matrixes are such that for each sub-matrix having a non-zero value, there is only a single 1 value present in each row of the sub-matrix. This implies that each non-zero sub-matrix specifies only a single bit which is to be used for calculating each parity bit. Since there are d non-zero sub-matrixes in each row of sub-matrixes, that means that there will be a total of d bits used to calculate a parity bit for each row of the actual H matrix.

Figure 3B:
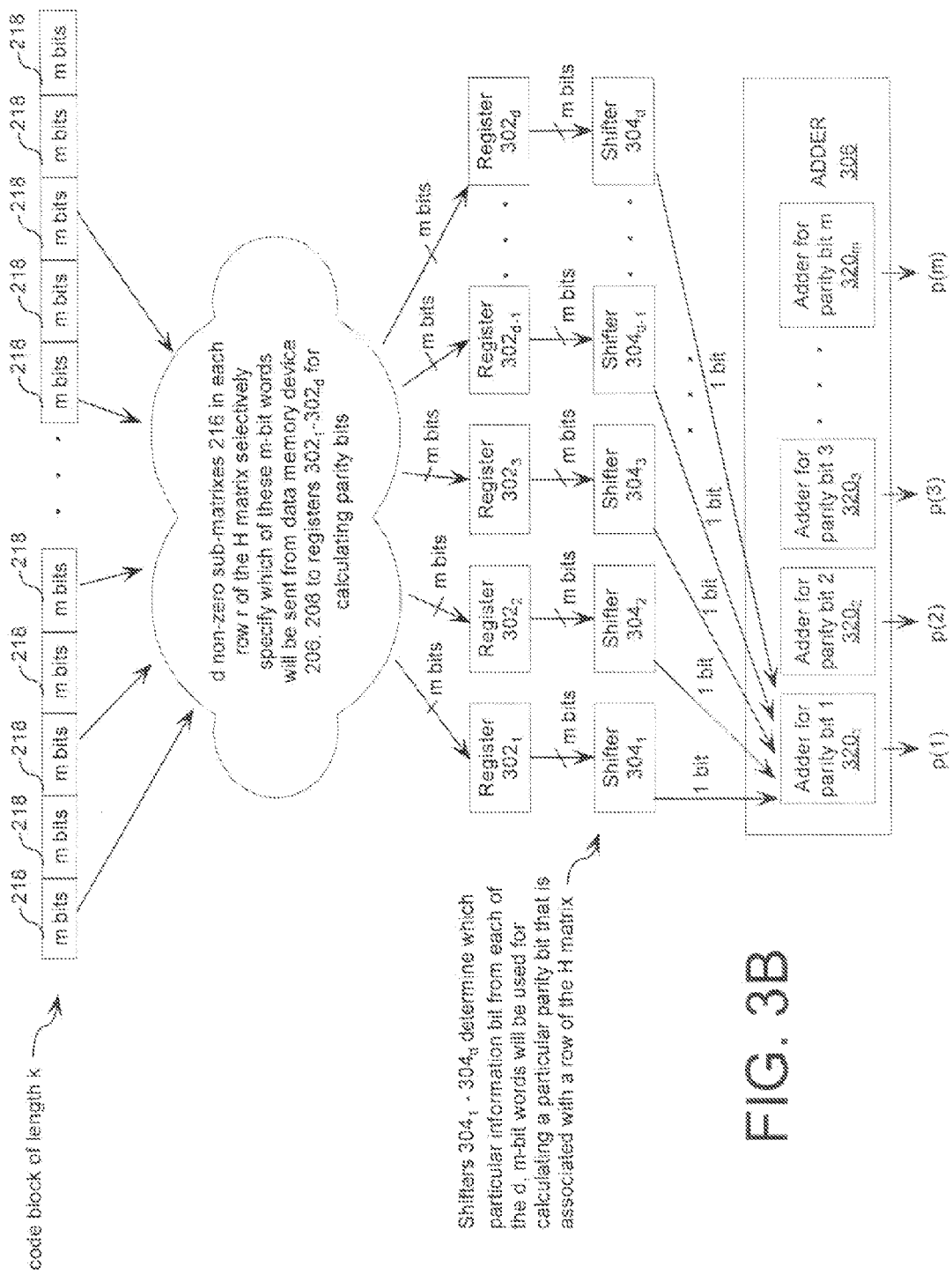
FIG. 3B is a conceptual diagram that is useful for understanding the calculation unit in FIG. 3A.

Still, a well designed LDPC requires significant flexibility with regard to the placement of 1 values within the H matrix. This in turn requires significant flexibility with regard to placement of 1 values within each of the sub-matrixes. Thus, one option would be to allow for random placement of 1 values within each sub-matrix. However, a better option is to partially constrain the sub-matrix as described above. For example, it is advantageous to constrain each sub-matrix so that 1 values are only permitted on a main diagonal of the sub-matrix. There are at least two advantages to doing so: (1) it guarantees that there will be one (and only one) information bit specified by each non-zero sub-matrix for use in the calculation of each parity bit, and (2) the position of the 1 values are always consecutive when considered from one row of the sub-matrix to the next row of the sub-matrix. The consecutive positioning of 1 values can be advantageous because it allows use of a shifting operation rather than a complete random reordering when transitioning from calculations for one row of the sub-matrix to the next row of the sub-matrix. This concept will be more fully understood with reference to FIG. 3B FIG. 3B shows a code block of k hits which is organized into a plurality of code words 218 as previously described in relation to FIG. 2. Each of the code words 218 are m bits in length. The d non-zero sub-matrixes 218 in a row r of the H matrix selectively specify which of these m-bit words will be sent from data memory device 208 or 208 to registers 3021-$302d$ for calculating parity bits. This selection process is performed by using the ASC generator to selectively provide addresses to data memory device 208 or 208 to identify the particular code words 218.

Once the d code words specified by the sub-matrixes have been respectively communicated to registers 3021-302d the shifters $304_1$-$304_d$ selectively perform a shift operation on each of the d, m-bit words. The shift operation is used to selectively direct each bit of each m-bit word to a proper one of the adders 320. The result is that each of the adders receives a selected input data bit from each shifter. These bits are then used to calculate each parity bit. For example, FIG. 3B shows one selected bit from each shifter being communicated to an adder 320 for a first parity bit p(1). In the same way, parity bits p(2), p(3) ... p(m) are all calculated concurrently for m rows of the matrix H. This concept is illustrated in FIG. 3C. This entire process shown in FIG. 3B can he repeated for each row r of sub-matrixes. For each such row m parity bits can be calculated in parallel, thus greatly increasing the rate at which parity bits can be calculated. Referring now to FIG. 3D, it can be observed that each group of m parity bits are stored in a parity memory device 508, 510 as an m bit word.

As will be readily appreciated by those skilled in the art, it is desirable for the parity bit calculation hardware to always perform the same operation, i.e. modulo 2 additions of ail the inputs to each parity bit. To achieve this, the hardware embodiment disclosed herein stores the shift values in an ASC generator 110 for each of the d non-zero elements, and then uses this value to determine the required shift. The advantage of this arrangement is that the calculation hardware only has to run at the throughput rate divided by m, and the m bit memory fetches only have to occur at the throughput rate divided by m times d. For example, if we use d=4, m=64, and a throughput rate of 500 Megabits per second, the calculation rate is only 7.8125 MHz and the fetch rate is only 31.25 MHz. Both of these rates are easily obtainable with today's technology. In fact, a much higher rate is achievable or a lower value of m could be chosen, thereby reducing the number of hardware elements.

The shifters $304_1$-$304_d$ are comprised of hardware and/or software configured to receive d, m bit words from a respective register $302_1$-$302_d$. The shifters $304_1$-$304_d$ are also comprised of hardware and/or software configured to receive u bit words containing shift count data from the ASC generator 110 (described above in relation to FIG. 1). The shifters $304_1$-$304_d$ are further comprised of hardware and/or software configured to circularly shift bits by a number of positions so as to obtain a shifted code word. The number of positions is defined by the shift count data received from the ASC generator 110, it should be noted that each m bit word is circularly shifted to correspond with a main diagonal position of a sub-matrix of the parity check matrix H, In this regard it should be appreciated that for each non-zero sub-matrix that does not have "ones" on a main diagonal, the corresponding m data bits are circularly shifted to an order that correctly aligns the input data bits with the respective output parity bits as would have existed if the sub-matrix were on the main diagonal.

Figure 4:
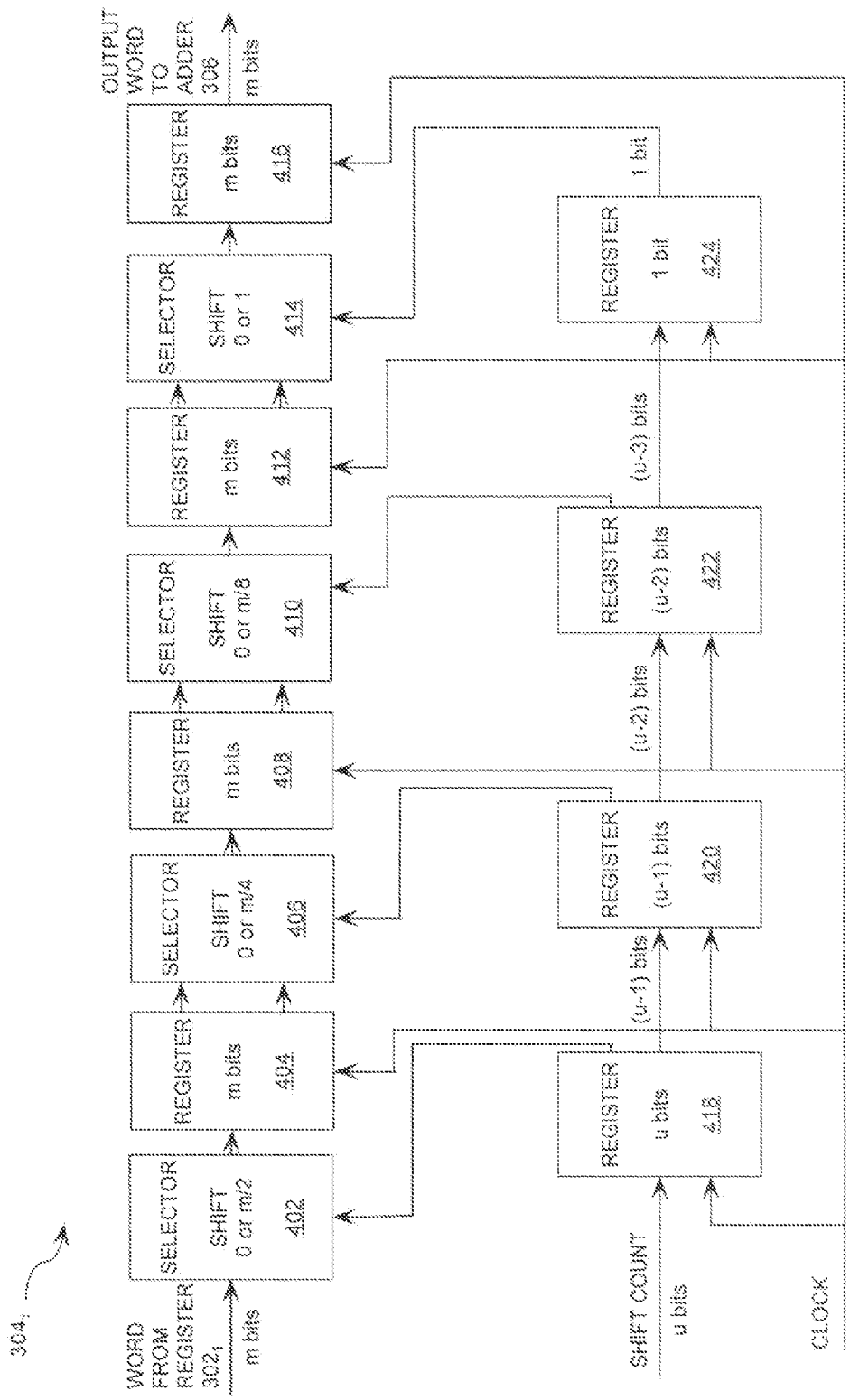
FIG. 4 is a block diagram of a shifter shown in FIG. 3A that is useful for understanding the present invention.

Referring again to FIG. 3A, the shifters $304_1$-$304_d$ are coupled to the adder 306. As such, the shifters $304_1$-$304_d$ are comprised of hardware and/or software configured to communicate shifted code words to the adder 306. In this regard, it should be understood thai each bit of the m bit words is communicated, in parallel, to the adder 306. Accordingly, each of the shifters $304_1$-$304_d$ is comprised of m output lines coupled to the adder 306. Each of the shifters $304_1$-$304_d$ communicates m bits to the adder 306 per clock cycle. The shifters $304_1$-$304_d$ can be normal shifters or a set of pipelined binary weighted shift multiplexers as shown in FIG. 4. It should be noted that a shifter $304_1$-$304_d$ comprising a set of pipelined binary weighted shift multiplexers provides better throughput as compared to a normal shifter. However, a pipelined shifter is more hardware intensive.

Referring again to FIG. 3A, the adder 306 is comprised of hardware and/or software configured to receive an m bit shifted code word from each of the shifters $304_1$-$304_d$. The adder 306 is also comprised of hardware and/or software configured to perform parallel arithmetic operations for producing m results. These arithmetic operations include modulo two (2) operations using the m bit words received from the shifters $304_1$-$304_d$ and the register 308. Each result of the modulo two (2) operations is a single bit result having a one (1) value or a zero (0) value.

According to an embodiment of the invention, the adder 308 is comprised of m adders 320. Each of the m adders has (d+1) inputs and one (1) output. Each of the m adders 320 receives one (1) bit from each of the shifters $304_1$-$304_d$ and one (1) bit from the register 308.

Referring again to FIG. 3A, a clock pulse is communicated from an external clock (not shown) to the adder 306 for controlling the same. The clock pulse can be synchronized with the serial data stream input into the adder 306. The clock pulse can be employed as a trigger to arithmetic operations for producing m results. The clock pulse can also be employed as a trigger to output results to the parity result memory 106 (described above in relation to FIG. 1) and register 308.

The register 308 is comprised of hardware and/or software configured to receive results output from the adder 306. The register 308 is also comprised of hardware and/or software configured to temporally store received results. The register 308 is also comprised of hardware and/or software configured to communicate results to the adder 306, in this regard, it should be appreciated that the results are communicated, in parallel, to the adder 306. Accordingly, the register 308 is comprised of m output lines coupled to the adder 306. The register 308 communicates m results (or bits) to the adder 306 per clock cycle. As shown in FIG. 3A, a clock pulse is communicated from an external clock (not shown) to the register 308 for controlling the same. The clock pulse can be synchronized with the serial data stream input into the register 308. The clock pulse can be employed as a trigger to communicate m bits to the adder 306.

It should be understood that, the calculation unit 104 runs at a throughput rate divided by m. The m bit words are fetched from the data memory 102 at d times the throughput rate divided by m. According to an embodiment of the invention, d equals four (4), m equals sixty-four (64), and the throughput rate equals five hundred (500) megabits per second. Accordingly, the calculation rate equals approximately eight mega hertz (7.8125 MHz≈8.0 MHz), The fetch rate equals approximately thirty-one mega hertz (31.25 MHz≈31 Mz). Still, the invention is not limited in this regard.

Referring now to FIG. 4, there is provided a block diagram of a shifter $304_1$ of FIG. 3A that is useful for understanding the present invention. However, the invention is not limited to the particular arrangement shown. It should be appreciated that the shifters $304_1$-$304_d$ can have the same or substantially similar architecture as that of the shifter $304_1$. As such, the following discussion with regard to the shifter $304_1$ is sufficient for understanding the shifters $304_2$-$304_d$.

As shown in FIG. 4, the shifter $304_1$ is comprised of selectors 402, 406, 410, 414 and registers 404, 408, 412-424. Each of these components 402-424 are well known to persons skilled in the art, and therefore will not be described in great detail herein. However, a brief discussion of the shifter $304_1$ architecture is provided to assist a reader in understanding the present invention.

Each of the selectors 402, 408, 410, 414 is comprised of hardware and/or software configured to receive an m bit word. Each of the selectors 402, 406, 410, 414 is also comprised of hardware and/or software configured to shift bits of an m bit word by a number of positions so as to obtain a shifted code word. The shifting of the code word is accomplished by the re-ordering of bits in the interconnection of the register output to one of the selector inputs. Each of the selectors 402, 406, 410, 414 is also comprised of hardware and/or software configured to communicate a shifted code word to a respective register 404, 408, 412, 418.

Each of the registers 404, 408, 412, 418 is comprised of hardware and/or software configured to receive an m parity bit word from a respective selector 402, 406, 410, 414. Each of the registers 404, 408, 412, 418 is also comprised of hardware and/or software configured to temporarily store a received m bit word. Each of the registers 404, 408, 412, 418 is further comprised of hardware and/or software configured to communicate an m hit word to a following device, such as a selector 406, 410, 414 or an adder 308 (described above in relation to FIG. 3A). As shown in FIG. 4, a clock pulse is communicated from an external clock (not shown) to the registers 404, 403, 412, 416 for controlling the same. The clock pulse can be synchronised with the serial data stream input into the registers 404, 408, 412, 416. The clock pulse can be employed as a trigger to communicate an m bit word to a respective selector 402, 406, 410, 414 or the adder 306.

The register 418 is comprised of hardware and/or software configured to receive a u bit word from the ASC generator 110 (described above in relation to FIG. 1). The u bit word contains shift count information. The register 418 is comprised of hardware and/or software configured to temporarily store a received u bit word, forward a first bit of the u bit word to the selector 402, and forward the remaining (u-1) bits to the register 420, The register 420 is comprised of hardware and/or software configured to receive the (u-1) bits from the register 418. The register 420 is also comprised of hardware and/or software configured to temporarily store a received (u-1) bits, forward a first bit of the (u-1) bits to the selector 406, and forward the remaining (a-2) bits to the register 422. The register 422 is comprised of hardware and/or software configured to receive the (u-2) bits from the register 420. The register 422 is also comprised of hardware and/or software configured to temporarily store a received (u-2) bits, forward a first bit of the (u-2) bits to the selector 410, and forward the remaining (u-3) bit to the register 424. The register 424 is comprised of hardware and/or software configured to receive the (u-3) bit from the register 422. The register 424 is also comprised of hardware and/or software configured to temporarily store the received (u-3) bit and forward the same to the selector 414.

As shown in FIG. 4, a clock pulse is communicated from an external clock (not shown) to the registers 418-424 for controlling the same. The clock pulse can be synchronized with the serial data stream input into the registers 418-424. The clock pulse can be employed as a trigger to communicate an m bit word to a respective selector 402, 406, 410, 414 and a following register 420-424.

It should be understood that the shifter $304_1$ can he generally thought of as a binary weighted shifting mechanism. Any arbitrary shift amount can he obtained by selecting or deselecting powers of two (2) for shifts. For example, if m equals sixteen (16), then the selector 402 shifts bits by zero (0) or eight (m/2=16/2=8) positions. The selector 408 shifts bits by zero (0) or four (m/4=16/4=4) positions. The selector 410 shifts bits by zero (0) or two (m/8=16/8=2) positions, The selector 414 shifts bits by zero (0) positions or one (1) position, By selecting specific combinations of these selector operations, a total shift amount having a value between zero (0) and fifteen (15) can be obtained.

The following Example is provided in order to illustrate the operation of the shifter $304_1$. The scope of the invention, however, is not to be considered limited in any way thereby.

EXAMPLE 1

Let m equal sixteen (16) and the desired total shift amount equal nine (9). In such a scenario, a u bit word is communicated from the ASC generator 110 (described above in relation to FIG. 1) to the register 418. The u bit world includes shift count information, More particularly, the u bit word is a binary representation of the desired total shift amount nine (9), As such, the u bit word is defined as a sequence 1 0 0 1. The register 418 communicates the first bit to the selector 402 and the remaining three (3) bits to the register 420. The first bit has a value of one (1). In effect, the selector 402 is transitioned into a first state. In this first state, the selector 402 circularly shifts each bit of an m bit word by eight (m/2=16/2=8) positions. Subsequently, the selector 402 communicates the shifted m bit word to the register 404. In turn, the register 404 temporarily stores the shifted m bit word and communicates the shifted m bit word to the selector 406.

The register 420 communicates the first bit of the received three (3) bits to the selector 406 and the remaining two (2) bits to the register 422, This bit has a value of zero. As such, the selector 406 is transitioned into a second state. In this second state, the selector 406 shifts the m bit word by zero positions. Subsequently, the selector 406 communicates the processed m hit word to the register 408. In turn, the register 408 temporarily stores the received m bit word and communicates the same to the selector 410.

The register 422 communicates the first bit of the received two (2) bits to the selector 410 and the remaining bit to the register 424. This bit has a value of zero. As such, the selector 410 is transitioned into a second state. In this second state, the selector 410 shifts the m bit word by zero positions. Subsequently, the selector 410 communicates the processed m bit word to the register 412. In turn, the register 412 temporarily stores the received m bit word and communicates the same to the selector 414.

The register 424 communicates the received bit to the selector 414. This bit has a value of one (1). In effect, the selector 414 is transitioned into a first state. In this first state, the selector 414 circularly shifts each bit of an m bit word by one (1) position. Subsequently, the selector 414 communicates the shifted m bit word to the register 418. In turn, the register 416 temporarily stores the shifted m bit word and communicates the shifted m bit word to the adder 306 (described above in relation to FIG. 3A). The m hit word output from the register 416 is a word containing m bits. Each of the m bits has been circularly shifted by nine (9) positions.

Figure 5:
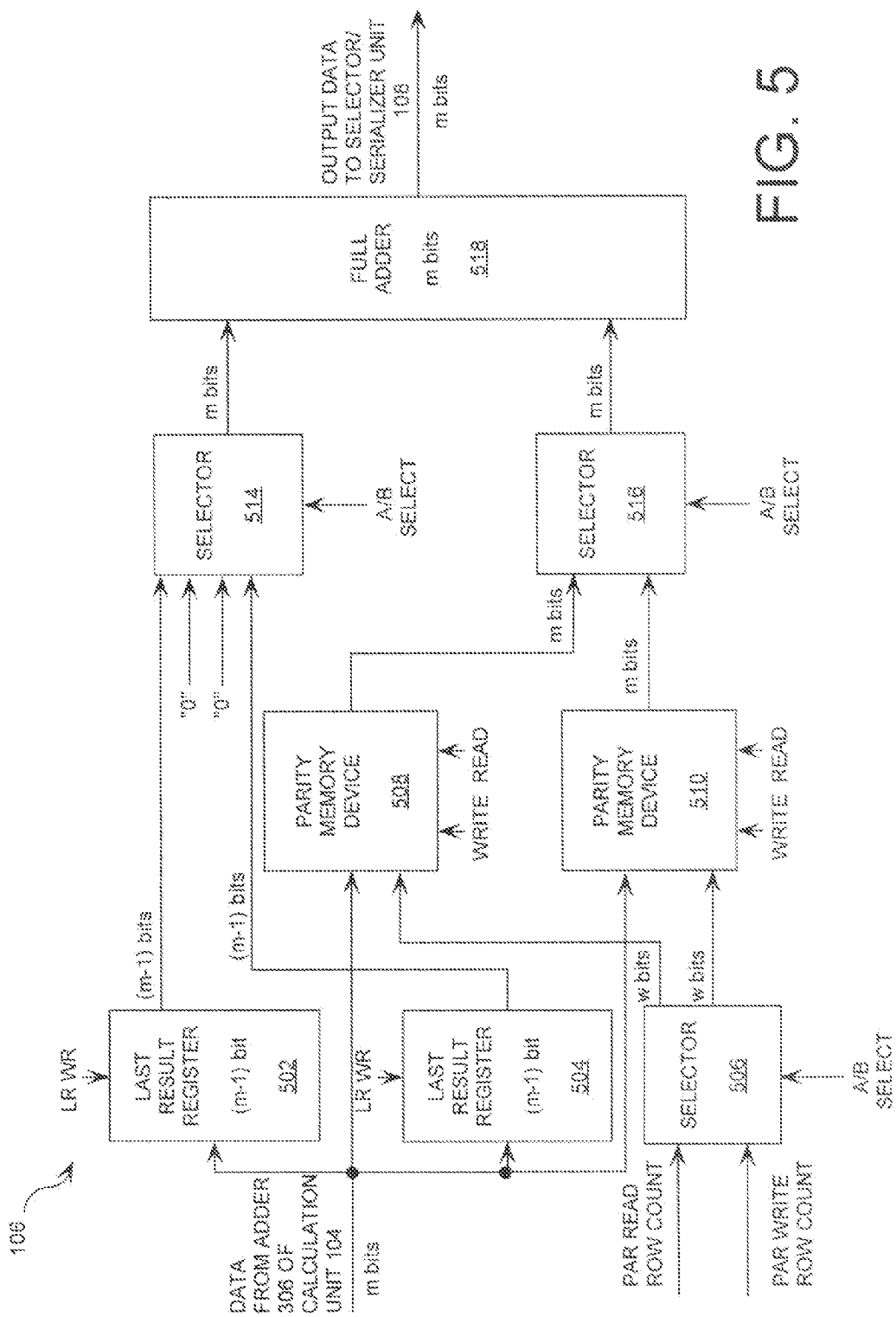
FIG. 5 is a block diagram of a parity result memory shown in FIG. 1 that is useful for understanding the present invention.

Referring now to FIG. 5, there is provided a block diagram of a parity result memory 106 of FIG. 1. Prior to describing the hardware architecture of FIG. 5 in detail it should be understood that the unique design of the parity check matrix H has hardware implications with regard to the parity result memory 106. As described above, the form of the second portion of the parity check matrix H is restricted such that each row includes two (2) ones (1s), except for the first row which includes a single one (1), This restriction implies that a first parity bit p(1) depends only on input data hits. The remaining parity bits p(2), . . . , p(m) depend on input data bits and another parity bit. Specifically, each parity bit p(t) other than a parity bit p(1) depends on a parity bit p(t-m) for (t≧m+1) and on a parity bit p((k−m)+t) for (k<m+1), k is a number of bits of input data. From a hardware perspective, this means that each m bits of parity, except for a first set of bits, needs to have a previous set of m bits modulo two (2) added to the result of an input data calculation. This is easily achieved with a register 308 (described above in relation to FIG. 3A) for storing previous results and an additional input to the modulo two (2) adder 306 (described above in relation to FIG. 3A). The first set of m parity bits also needs to have the bits from the above formula incorporated therein. This incorporation is achieved by storing the last calculated m bit word, shifting the m bits of the last calculated m bit word to the right by one (1) position, and adding the shifted m bit word to all of the m bit parity words as they are retrieved from the parity memory devices 508, 510 (described below). This incorporation is easily achieved with one or more registers 502, 504 (described below), a selector 514 (described below), and a full adder structure 518 (described below).

Referring again to FIG. 5, the parity result memory 106 is comprised of last result registers 502, 504, parity memory devices 508, 510, selectors 506, 514, 518, and a full adder 518. Each of these components 502-518 are well known to persons skilled in the art, and therefore will not be described in great detail herein. However, a brief discussion of the result memory device 108 architecture is provided to assist a reader in understanding the present invention.

The selector 506 is comprised of hardware and/or software configured to receive a signal including parity read row count data or parity write row counts data from the controller state machine 112. The selector 508 is also comprised of hardware and/or software configured to forward a signal including parity read row count data to the parity memory devices 508, 510 for reading data from memory 508, 510 locations. The selector 508 is further comprised of hardware and/or software configured to forward a signal including parity write row counts data to the parity memory devices 508, 510 for writing input data to memory 508, 510 locations.

As shown in FIG. 5, an A/B select signal is communicated from the controller state machine 112 (described above in relation to FIG. 1) to the selector 506 for controlling the same. For example, if the A/B select signal is a high logic signal, then the selector 508 forwards a signal including parity read row count data to the parity memory device 508. The selector 508 also forwards a signal including parity write row counts data to the parity memory device 510. Alternatively, if the A/B select signal is a low logic signal, then the selector 508 forwards a signal including parity read row count data to the parity memory device 510. The selector 204 forwards a signal including parity write row counts data to the parity memory device 508.

The parity memory devices 508, 510 are comprised of hardware and software configured to receive data (i.e., results r(0), . . . , r(m)) from the adder 306 (described above in relation to FIG. 3A-3D) of the calculation unit 104. The parity memory devices 508, 510 are also comprised of hardware and software configured to store received data. In this regard, it should be appreciated that a write or read signal is communicated from the controller state machine 112 (described above in relation to FIG. 1) to the parity memory devices 508, 510 for controlling the same. For example, if the controller state machine 112 communicates a write control signal to the parity memory devices 508,510 then data is whiten to sequentially ordered memory 508, 510 locations. Alternatively, if the controller state machine 112 communicates a read control signal to the parity memory devices 508, 510 then data is retrieved from sequentially ordered memory 508, 510 locations and forwarded to the selector 514, it should also be understood that the parity result memory 106 is further configured to allow parallel data acquisition and processing. Accordingly, data is written info the parity memory device 508 when data is being read from the parity memory device 510, Conversely, data is written into the parity memory device 510 when data is being read from the parity memory device 508. This method of storing and retrieving data is similar to the method described above in connection data memory devices 208, 208 in FIGS. 2A and 28. Such a ping-pong memory configuration provides a fast processing time feature to the parity result memory 108.

The selector 518 is comprised of hardware and software configured to retrieve data (i.e., results r(0), . . . , r(m)) from the parity memory devices 508, 510. The selector 516 is also comprised of hardware and software configured to select which parity memory device 508, 510 to retrieve data from at any given time. The selector 516 is further comprised of hardware and software configured to forward received data (i.e., results r(0), . . . , r(m)) to the full adder 518 for processing. In this regard, it should be appreciated that an A/B select signal is communicated from the controller state machine 112 (described above in relation to FIG. 1) to the selector 516 for controlling the same. For example, if the A/B select signal is a high logic signal, then the selector 516 retrieves data from the parity memory device 508, The selector 516 forwards the data to the full adder 518. Alternatively, if the A/B select signal is a low logic signal, then the selector 518 retrieves data from the parity memory device 510. The selector 516 forwards the data to the full adder 518.

Referring again to FIG. 5, the last result registers 502, 504 are comprised of hardware and software configured to receive data (i.e. results r(0), . . . , r(m)) from the adder 306 (described above in relation to FIG. 3A) of the calculation unit 104. The last result registers 502, 504 are also comprised of hardware and software configured to store received data. In this regard, it should be appreciated that a last result (LR) write signal is communicated from the controller state machine 112 (described above in relation to FIG. 1) to each of the last result registers 502, 504 for controlling the same. For example, if the last result register 502 receives a high logic LR write signal, then data (i.e., results r(0), . . . , r(m)) is written to last result register 502 memory locations. Alternatively, if the write signal is a low logic write signal, then data (i.e., results r(0), . . . , r(m)) is not written to last result register 502 memory locations. The last result registers 502, 504 are further comprised of hardware and/or software configured to communicate (m-1) bit words to the selector 514.

The selector 514 is comprised of hardware and software configured to retrieve last result data hem the last result registers 502, 504. The selector 514 is also comprised of hardware and software configured to select which last result register 502, 504 to retrieve last result data from during a particular interval of time. The selector 514 is further comprised of hardware and software configured to forward last result data to the full adder 518 for processing. In this regard, it should be appreciated that an A/B select signal is communicated from the controller state machine 112 (described above in relation to FIG. 1) to the selector 514 for controlling the same. For example, if the A/B select signal is a high logic signal, then the selector 514 communicates a first bit having a zero (0) value to the full adder 518, retrieves (m-1) hits of last result data from the last result register 502, and forwards the (m-1) bits of last result data to the adder 518. Alternatively, if the A/B select signal is a low logic signal, then the selector 514 communicates a first bit having a zero (0) value to the full adder 513, retrieves (m-1) bits of last result data from the last result register 504, and forwards the (m-1) bits of last result data to the adder 518.

The full adder 518 is comprised of hardware and software configured to receive data from the selectors 514, 516. The full adder 518 is also comprised of hardware and software configured to perform an addition operation on three (3) one bit binary digits to produce a sum and a carry value. Each of the sum and carry values is a binary digit having a zero (0) value or a one (1) value. The full adder 518 is further comprised of hardware and software configured to forward the sum (i.e., parity bit) to the selector/serializer unit 103 (described above in relation to FIG. 1 and below in relation to FIG. 6). The full adder 518 is further comprised of hardware and software configured to use the carry value in a subsequent addition operation so that a carry value is propagated through an m bit word.

Full Adder Description

As noted above, the unique design of the B portion of the H matrix has hardware implications as well. The more conventional form of the B portion of the H matrix is a single diagonal of "1"s, which implies that each parity bit is the product of only the input data bits and does not depend on the other parity bits, in our matrix we have two "1"s on every row except the very first row. This implies that the very first parity bit depends only on the input data bits, but every other parity bit depends on another parity bit as well. (This is why the last sub-matrix bit in the very first row was deleted; else wise the code would be circularly defined.) Specifically, each parity bit, p(t), except p(0), depends on p(t-m) for (t>=m) and on p((n−k−m−1)+t) for (t<m). From a hardware perspective this means that each m bits of parity except, for the very first set, needs to have the previous set of m bits modulo 2 added to the result of the input data calculation. This is easily achieved with a register for storing the previous result and an additional input to the modulo 2 adder as shown in FIG. 3. The very first set of m bits also needs to have the bits from the above formula incorporated, which corresponds the last set of m bits calculated, being shifted right by one, and added to the first set of bits. Since this would have rippled through all of the bits, we take advantage of the associative nature of the addition and do this operation as we retrieve the results from the memory on the output of the encoder by using a full adder structure to account for the carries, as shown in FIG. 5.

The full adder structure 518, has two inputs of m bits each. The first input from selector 514, will be referred to as input "a" having bits a(0), a(1), a(2), . . . a(m-1). The second input from selector 516 will be referred to as input "b" having bits b(0), b(1), b(2), ... b(m-1). The output of the full adder 518, will be referred to as output c having bits c(0), c(1), c(2), ... c(m-1). The input "a" is from the last result registers 502 or 504 and remains constant for the entire time associated with processing a particular code block. The "b" input receives m bit words from the parity memory devices 508 or 510 during the second half of the block cycle. The full adder equations are detailed below. Note that the "a" input does not change during the entire time associated with processing a particular code block, and the equation terms are grouped using parenthesis to indicate that the processing on the "a" bits is performed first and the "b" inputs are added at the very last. This ensures high rate processing. All "+" operations below are modulo 2 additions.

$c(0)=b(0)$; The a(0) input is always "0" and is therefore ignored.

$c(1)=(a(1))+b(1)$;

$c(2)=(a(2)+a(1))+b(2)$;

$c(3)=(a(3)+a(2)+a(1))+b(3)$;

$c(4)=(a(4)+a(3)+a(2)+a(1))+b(4); \ldots$ $c(m-1)=(a(m-1)+a(m-2)+ \ldots +a(2)+a(1))+b(m-1)$;

Since half of a block time is available to perform the additions of the a(I) bits, they can be performed as a string of two input modulo 2 adders as indicated by the parentheses below:

$(a(4)+(a(3)+(a(2)+a(1))))$;

First a(1) is added to a(2) and the result is used to add to a(3) and is also used to calculate c(2) and so on. The carry forward of the "a" input bits to each successive column accounts for the ripple effect of not having the p(t) values that depend on p(n−k−m−1)+t) for (t<m) during the initial calculation of the parity bits. This results in every column of parity bits after the first column being either inverted or not inverted depending on the state of the last bit of the previous column.

Figure 6:
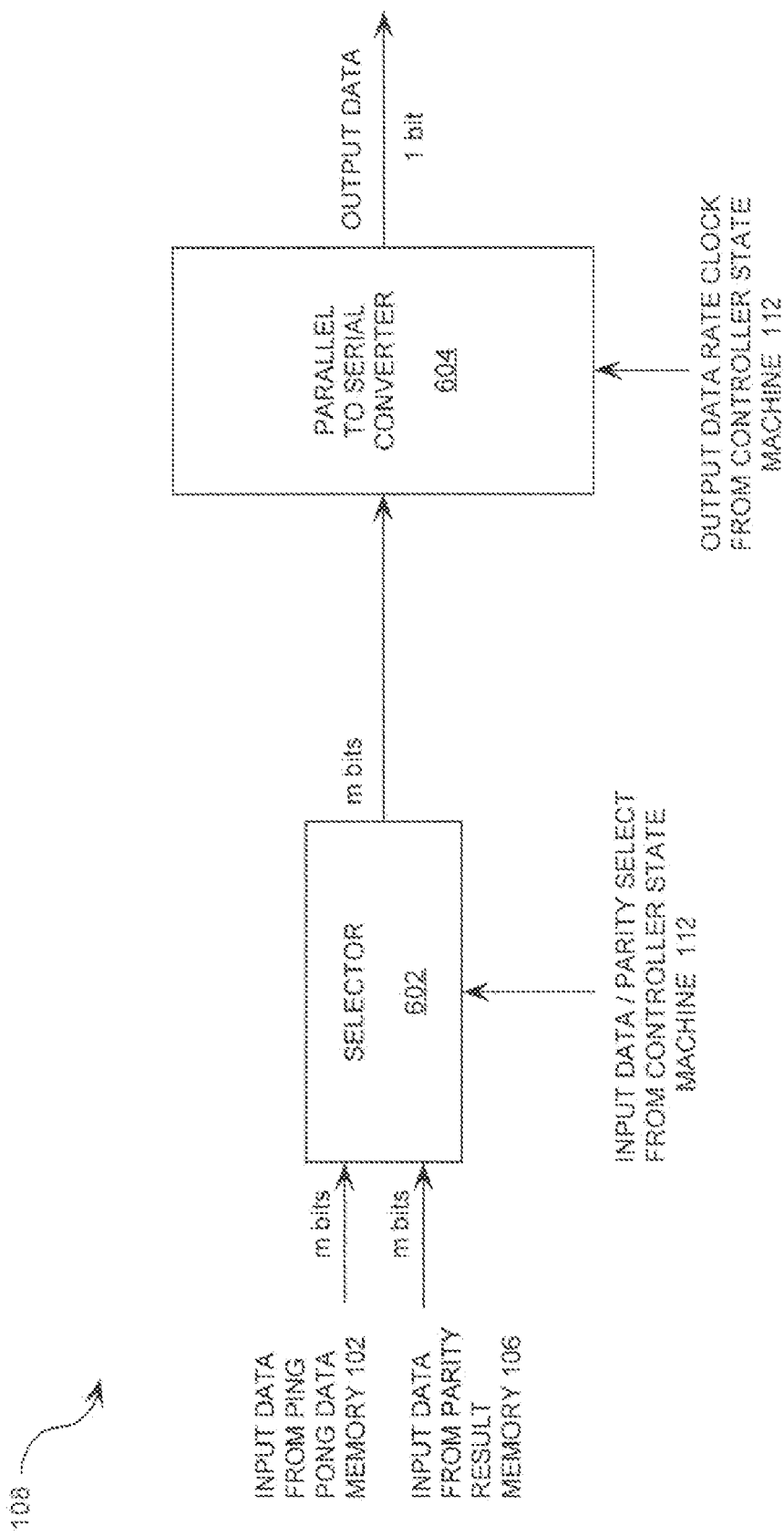
FIG. 6 is a block diagram of a selector/serializer unit shown in FIG. 1 that is useful for understanding the present invention.

Referring now to FIG. 6, there is provided a block diagram of the selector/serializer unit 108 shown in FIG. 1. As shown in FIG. 6, the selector/serializer unit 108 is comprised of a selector 602 and a parallel to serial (P/S) converter 604. Each of these components 602, 604 are well known to persons skilled in the art, and therefore will not be described in great detail herein. However, a brief discussion of the selector/serializer unit 108 architecture is provided to assist a reader in understanding the present invention.

Referring again to FIG. 8, the selector 802 is comprised of hardware and/or software configured to retrieve input data from the data memory 102 (described above in relation to FIG. 1 and FIG. 2) and parity bits from the parity result memory 106 (described above in relation to FIG. 1 and FIG. 5). The selector 602 is also comprised of hardware and software configured to select which memory 102, 106 to retrieve data from at any given time. The selector 602 is further comprised of hardware and software configured to forward received data (i.e., input data or parity bits) to the P/S converter 604 for processing, in this regard, it should he appreciated that an input data/parity select signal is communicated from the controller state machine 112 (described above in relation to FIG. 1) to the selector 602 for controlling the same. For example, if the input data/parity select signal is a high logic signal, then the selector 602 retrieves input data from the data memory 102. The selector 602 forwards the input data to the P/S converter 604. Alternatively, if the input data/parity select signal is a low logic signal, then the selector 602 retrieves parity bits from the parity result memory 106. The selector 602 forwards the parity bits to the P/S converter 604.

The P/S converter 604 is comprised of hardware and/or software configured to receive parallel input data and parity bits from the selector 602. The P/S convener 604 is also comprised of hardware and/or software configured to the parallel input data and parity bits into a serial data stream. The P/S converter 604 is further comprised of hardware and/or software configured to communicate a serial input data streams and serial parity data streams to an external device (not shown). As shown in FIG. 6, an output data rate clock pulse is communicated from the controller state machine 112 (described above in relation to FIG. 1) to the P/S converter 604 for driving the same. The clock pulse can be employed as a trigger to convert the parallel data into a serial data stream. The clock pulse can also be employed as a trigger to communicate a serial data stream to an external device (not shown).

Figure 7:
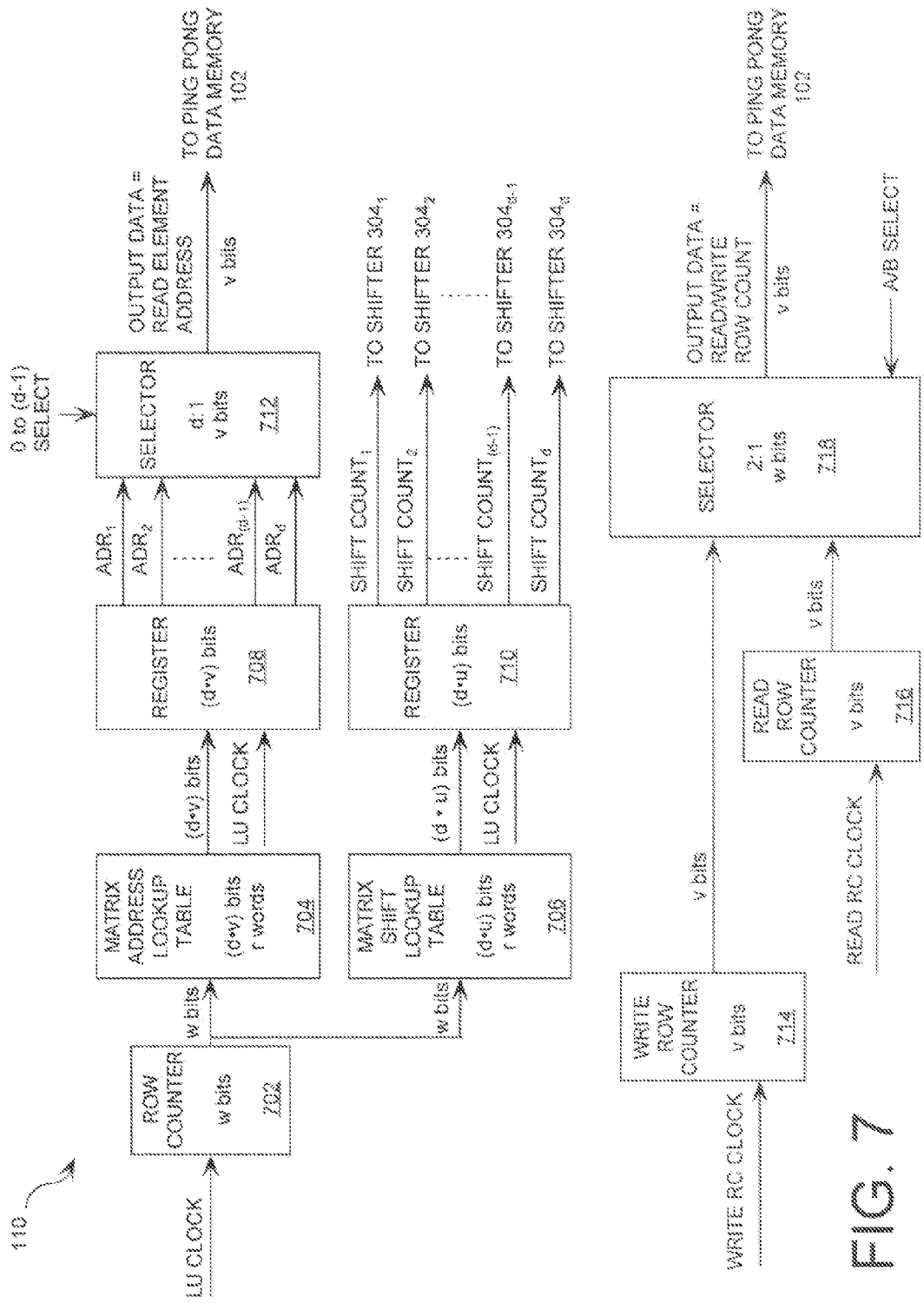
FIG. 7 is a block diagram of an address and shift count generator shown in FIG. 1 that is useful for understanding the present invention.

Referring now to FIG. 7, there is provided a block diagram of the ASC generator 110 of FIG. 1. Prior to describing the hardware architecture of FIG. 7, if should be understood that the unique design of the parity check matrix H has hardware implications with regard to the ASC generator 110, Specifically, the above described restrictions of the parity check matrix H allow for a relatively simple hardware implementation of the ASC generator 110. For example, a number of bits required to be stored in a memory for representing the parity check matrix H is relatively small as compared to conventional hardware implementations. In this regard, if should be appreciated that a non-zero sub-matrix can be identified by simply identifying for each row of the parity check matrix H which columns of the (c-r) columns the non-zero sub-matrix resides in. The non-zero sub-matrix can also be identified by determining which of "m" possible shifts is used for creating a circular right shifted version of an identity matrix. As a consequence of such sub-matrix identification processes, the number of bits required to be stored in a memory for representing the parity check matrix H is greatly reduced.

The number required to be stored in a memory for representing the parity check matrix H equals (n·k) bits, where n is a number of bits per code word and k is a total number of input data bits. The value (n·k) can be a very large number in certain scenarios. For example, if a block code is defined as a (8192, 4096) code, then thirty-three million five hundred fifty-four thousand four hundred thirty-two (33,554,432) bits are required to be stored in a memory for representing the parity check matrix H. However, if each row of a sub-matrix has a maximum number of nonzero elements ("d"), then a substantially reduced number of bits is required to be stored in a memory for representing the parity check matrix H. This number can be defined by the following mathematical equation: $d \cdot R \cdot (B_c + B_s)$, where d is a maximum number of non-zero elements in each row of a sub-matrix. R is a number of rows of a sub-matrix, $B_c$ is a number of bits required to represent the (c-r) columns of the parity check matrix H, $B_s$ is a number of bits required to represent "m" possible shifts used for creating a circular right shifted version of an identity matrix, if a block code is defined as a (8192, 4096) code, m is equal to sixty-four (64), and d is equal to four (4), then only one hundred ninety-six thousand six hundred eight (198,608) bits is required to be stored in a memory for representing the placement of the non-zero element in the portion A of the parity check matrix H.

The bits required for representing the parity check matrix H in memory can be stored in memory lookup tables. For example, a first lookup table can be provided for the location of the sub-matrices in each row that has (c-r) memory location with each memory location having d addresses of the non-zero elements of the A matrix. Each address requires v bits where $(c-r) \leq 2^v$. In effect, the total number of bits required to store the addresses is (d·v·r). A second memory lookup table can be provided for the shift count of the sub-matrices in each row that has r memory locations with each memory location having d shift counts of the non-zero elements of the A matrix. Each shift count requires u bits where $m \leq 2^u$. In effect, the total number of bits required to store the shift counts is (d·u·r).

Referring again to FIG. 7, the ASC generator 110 is composed of a row counter 702, a matrix address lookup table 704, a matrix shift lookup table 706, registers 703, 710, and a selector 712. The ASC generator 110 is also comprised of a write row counter 714, a read row counter 716, and a selector 718. Each of these components 702-718 are well known to persons skilled in the art, and therefore will not be described in great detail herein. However, a brief discussion of the ASC generator 110 architecture is provided to assist a reader in understanding the present invention.

Referring again to FIG. 7, the row counter 702 is an up counter that provides memory location addresses for the matrix address lookup table 704 and the matrix shift lookup table 708. The row counter 702 is comprised of hardware and/or software configured to increment once for every clock cycle. In this regard, it should be appreciated that a lookup (LU) clock pulse is communicated from an external dock (not shown) to the row counter 702 for driving the same. The clock pulse can be employed as a trigger to increment by one (1) value. The clock pulse can also be employed as a trigger to communicate memory location address data (i.e., an increment value) to the matrix address lookup table 704 and the matrix shift lookup table 708.

The matrix address lookup table 704 is a memory device containing address data defining where the locations of the non-zero elements are in the parity check matrix H. These addresses are stored in a table format, in this regard, it should be understood that the addresses are stored as r words including (d·v) bits. Each word includes address data for d locations of non-zero elements in the parity check matrix H. The matrix shift lookup fable 708 is a memory device containing shift count data. This shift count data is stored in a table format, in this regard, if should be understood that the shift count data is stored as r words including (d·u) bits.

The register 708 is comprised of hardware and/or software configured to retrieve address data from the matrix address lookup table 704, The register 708 is also comprised of hardware and/or software configured to temporality store received address data, The register 708 is further comprised of hardware and/or software configured to communicate address data to the selector 712. As shown in FIG. 7, a LU clock pulse is communicated from an external clock (not shown) to the register 703 for controlling the same. The clock pulse can be synchronized with the serial data stream input into the register 708. The clock pulse can be employed as a trigger to retrieve address data from the matrix address lookup fable 704. The dock pulse can also be employed as a trigger to communicate address data to the selector 712.

The selector 712 is comprised of hardware and/or software configured to retrieve address data from the register 708. The selector 712 is also comprised of hardware and software configured to select which address data to retrieve from the register 708 at any given time The selector 712 is further comprised of hardware and software configured to forward address data to the data memory 102 (described above in relation to FIG. 1 and FIG. 2). In this regard, if should be appreciated that select signals are communicated from the controller state machine 112 (described above in relation to FIG. 1) to the selector 712 for controlling the same. For example, if the select signal is a first high logic signal, then the selector 712 retrieves a first set of address data from the register 708. The selector 712 forwards this first set of address data to the data memory 102. If the select signal is a second high logic signal, then the selector 712 retrieves a second set of address data from the register 708. The selector 712 forwards this second set of address data to the data memory 102, and so on. Each sat of address data include v bits.

The register 710 is comprised of hardware and/or software configured to retrieve shift count data from the matrix shift lookup fable 708 The register 710 is also comprised of hardware and/or software configured to temporality store received shift count data. The register 710 is further comprised of hardware and/or software configured to communicate shift, count data to the shifters $304_1$-$304_d$ of the calculation unit 104. As shown in FIG, 7, a LU clock pulse is communicated from an external clock (not shown) to the register 710 for controlling the same. The clock pulse can be synchronized with the serial data stream input info the register 710. The clock pulse can be employed as a trigger to retrieve shift count data from the matrix shift lookup table 708, The clock pulse can also be employed as a trigger to communicate shift count data to the shifters $304_1$-$304_d$.

The write row counter 714 is an up counter that provides write row count data for writing input data to data memory device 208, 208 locations (described above in relation to FIG. 2). The write row counter 714 is comprised of hardware and/or software configured to increment once for every clock cycle. In this regard, it should be appreciated that a write row count (SRC) clock pulse is communicated from an external clock (not shown) to the write row counter 714 for driving the same. The write RC clock pulse can be employed as a trigger to increment by one (1) value, The write RC clock pulse can also be employed as a trigger to communicate write row count data (i.e.,, an increment value) to the selector 718.

The read row counter 716 is an up counter that provides read row count data for reading input data from data memory device 206, 208 locations (described above in relation to FIG. 2). The read row counter 718 is comprised of hardware and/or software configured to increment once for every clock cycle. In this regard, it should be appreciated that a read row count (RC) clock pulse is communicated from an external clock (not shown) to the read row counter 718 for driving the same. The read RC clock pulse can be employed as a trigger to increment by one (1) value. The read RC clock pulse can also be employed as a trigger to communicate read row count data (i.e., an increment value) to the selector 718.

The selector 718 is comprised of hardware and/or software configured to retrieve write row count data from the write row counter 714 and read row count data from the read row counter 718, The selector 718 is also comprised of hardware and software configured to select which counter 714, 716 to retrieve data from. The selector 713 is further comprised of hardware and software configured to forward write row count data and read row count data to the data memory 102 (described above in relation to FIG. 1 and FIG. 2). In this regard, if should be appreciated that an A/B select signal is communicated from the controller state machine 112 (described above in relation to FIG. 1) to the selector 718 for controlling the same. For example, if the A/B select signal is a high logic signal, then the selector 718 retrieves write row count data from the write row counter 714. The selector 718 forwards this write row count data to the data memory 102. If the A/B select signal is a low logic signal, then the selector 718 retrieves read row count data from the read row counter 718. The selector 718 forwards this read row count data to the data memory 102, and so on.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, splat and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. A method for generating a low-density parity-check code, comprising:
    using a code block of binary information bits to calculate a plurality of parity bits based on a defined parity check matrix H representing a set of linear modulo 2 parity check equations; and
    combining said plurality of parity bits with said block of binary information bits to form a code word;
    wherein said parity check matrix H is defined to include portions A and B such that the parity check matrix H=[A|B], and each row of the parity check matrix H represents one of said parity check equations for generating one of said parity bits;
    wherein said parity check matrix H is constrained so that said portions A and B are each defined by a plurality of m by m bit sub-matrixes, and each row of said portion B has two values which are equal to the number 1, except for the first row of said portion B which includes a single value equal to the number 1; and
    wherein each said sub-matrix is constrained to be an all zero (0) matrix, an identity matrix, or a circular right shifted version of said identity matrix.

2. The method according to claim 1, further comprising constraining the B portion to exclusively comprise the value 1 on the main diagonal and on a second diagonal that is left circularly shifted m times from the main diagonal.

3. The method according to claim 1, wherein said code block contains k bits and further comprising storing said code block in a data memory device as r, m-bit code words, where r equal k/m.

4. The method according to claim 1, wherein said code block is comprised of k bits and further comprising arranging said k bits into r, m-bit code words, where r equals k/m.

5. The method according to claim 4, further comprising selecting a predetermined number d of said m-bit code words to perform calculations for determining a set of m parity bits.

6. The method according to claim 5, further comprising selecting each of said d, m-bit code words only if a column position of said m-bit code word corresponds to one of m column positions contained with one of said sub-matrixes which has a non-zero value.

7. The method according to claim 6, further comprising using said d, m-bit code words and said sub-matrixes with non-zero values to perform calculations for determining at least one parity bit corresponding to a row of said matrix H.

8. The method according to claim 7, further comprising using said d, m-bit code words and said sub-matrixes with non-zero values to concurrently perform m parallel sets of said calculations for determining a set of m parity bits corresponding to m rows of said matrix H.

9. The method according to claim 8, further comprising repeating said m parallel calculations for each row of sub-matrixes which are contained in said H matrix.

10. The method according to claim 7, wherein said calculations include at least one circular shift operation of a code word.

11. The method according to claim 1, further comprising storing a definition of said parity check matrix H by storing a row and a column position of each of said sub-matrixes which have a non-zero value.

12. The method according to claim 1, further comprising storing a definition of said parity check matrix H by storing shift data which identifies which of m possible shifts is used for creating a circularly shifted version of an identify matrix.

13. A system for generating a low-density parity-check code, comprising:
    a data memory device for storing a block of binary information bits comprising a code block;
    a calculation unit coupled to said data memory device and configured to calculate a plurality of parity bits based on a defined parity check matrix H representing a set of linear modulo 2 parity check equations; and
    a selector/serializer configured to combine said plurality of parity bits with said block of binary information bits to form a code word;
    wherein said parity check matrix H include portions A and B such that the parity check matrix H=[A|B], and each row of the parity check matrix H represents one of said parity check equations for generating one of said parity bits;
    wherein said parity check matrix H is constrained so that said portions A and B are each defined by a plurality of sub-matrixes, and each row of said portion B has two values which are equal to the number 1, except for the first row of said portion B which includes a single value equal to the number 1; and
    wherein each said sub-matrix is constrained to be an all zero (0) matrix, an identity matrix, or a circular right shifted version of said identity matrix.

14. The system according to claim 13, wherein the matrix B exclusively comprises the value 1 on the main diagonal and on a second diagonal that is left circularly shifted m times from the main diagonal.

15. The system according to claim 13, wherein said code block contains k bits and wherein said data memory device is arranged for storing said code block in said data memory device as r, m-bit code words, where r equal k/m.

16. The system according to claim 13, wherein said code block is comprised of k bits and further comprising means for parsing said k bits into r, m-bit code words, where r equals k/m.

17. The system according to claim 15, further comprising an address generator configured for selecting a predetermined number d of said m-bit code words to perform calculations for determining a set of m parity bits.

18. The system according to claim 17, further wherein said address generator is configured for selecting each of said d, m-bit code words only if a column position of said m-bit code word corresponds to one of m column positions contained with one of said sub-matrixes which has a non-zero value.

19. The system according to claim 18, further comprising a calculation unit configured for using said d, m-bit code words and said sub-matrixes with non-zero values to perform calculations for determining at least one parity bit corresponding to a row of said matrix H.

20. The system according claim 19, wherein said calculation unit comprises a shifter configured for performing a circular shift of at least one of said code words.

21. The system according to claim 19, further comprising a calculation unit configured for using said d, m-bit code words and said sub-matrixes with non-zero values to concurrently perform m parallel sets of said calculations for determining a set of m parity bits corresponding to m rows of said matrix H.

22. The system according to claim 13, wherein further comprising at least one data store for defining said parity check matrix H by identifying a row and a column position of each of said sub-matrixes which have a non-zero value.

23. The system according to claim 13, further comprising at least one data store containing a definition of said parity check matrix H, said definition containing shift data for identifying which of m possible shifts is used for creating a circularly shifted version of an identify matrix.

* * * * *